US010298863B2

(12) United States Patent
Silverstein et al.

(10) Patent No.: US 10,298,863 B2
(45) Date of Patent: May 21, 2019

(54) AUTOMATIC COMPENSATION OF LENS FLARE

(71) Applicant: Apple Inc., Cupertino, CA (US)

(72) Inventors: D. Amnon Silverstein, Palo Alto, CA (US); Sheng Lin, San Jose, CA (US); David R. Pope, Fremont, CA (US); Suk Hwan Lim, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 142 days.

(21) Appl. No.: 14/848,276

(22) Filed: Sep. 8, 2015

(65) Prior Publication Data

US 2017/0070689 A1 Mar. 9, 2017

(51) Int. Cl.
*H04N 5/357* (2011.01)
*H01L 27/146* (2006.01)
(Continued)

(52) U.S. Cl.
CPC ........... *H04N 5/3572* (2013.01); *G06T 5/008* (2013.01); *H01L 27/14623* (2013.01);
(Continued)

(58) Field of Classification Search
CPC .... H04N 5/3572; H04N 5/3696; H04N 9/646; H04N 5/3651; H01L 27/14643; H01L 27/14623; G06T 5/008
(Continued)

(56) References Cited

U.S. PATENT DOCUMENTS 7,305,141 B2 12/2007 Jaspers
7,812,881 B2 10/2010 Kusaka
(Continued)

FOREIGN PATENT DOCUMENTS

JP 2009296224 * 4/2008 ............. H04N 5/232

OTHER PUBLICATIONS

International Search Report and Written Opinion from PCT/US2016/047873, dated Jan. 11, 2017, Apple Inc., pp. 1-18.
(Continued)

*Primary Examiner* — Lin Ye
*Assistant Examiner* — Chan T Nguyen
(74) *Attorney, Agent, or Firm* — Robert C. Kowert; Meyertons, Hood, Kivlin, Kowert & Goetzel, P.C.

(57) ABSTRACT

Systems and methods for automatic lens flare compensation may include a non-uniformity detector configured to operate on pixel data for an image in an image sensor color pattern. The non-uniformity detector may detect a non-uniformity in the pixel data in a color channel of the image sensor color pattern. The non-uniformity detector may generate output including location and magnitude values of the non-uniformity. A lens flare detector may determine, based at least on the location and magnitude values, whether the output of the non-uniformity detector corresponds to a lens flare in the image. In some embodiments, the lens flare detector may generate, in response to determining that the output corresponds to the lens flare, a representative map of the lens flare. A lens flare corrector may determine one or more pixel data correction values corresponding to the lens flare and apply the pixel data correction values to the pixel data.

17 Claims, 12 Drawing Sheets

(51) Int. Cl.
*H04N 5/369* (2011.01)
*H04N 9/64* (2006.01)
*H04N 5/365* (2011.01)
*G06T 5/00* (2006.01)

(52) U.S. Cl.
CPC ..... *H01L 27/14643* (2013.01); *H04N 5/3651* (2013.01); *H04N 5/3696* (2013.01); *H04N 9/646* (2013.01)

(58) Field of Classification Search
USPC .......................................................... 348/242
See application file for complete search history.

(56) References Cited

U.S. PATENT DOCUMENTS

| | | | |
|---|---|---|---|
| 2009/0147116 A1 | 6/2009 | Koyama et al. | |
| 2011/0242352 A1 | 10/2011 | Hikosaka | |
| 2011/0298944 A1* | 12/2011 | Kuo | H04N 5/3572 348/223.1 |
| 2013/0321676 A1 | 12/2013 | Silverstein et al. | |
| 2013/0329132 A1* | 12/2013 | Tico | H04N 5/14 348/571 |
| 2014/0313350 A1* | 10/2014 | Keelan | H04N 9/045 348/188 |
| 2015/0015750 A1 | 1/2015 | Stern et al. | |
| 2015/0146014 A1* | 5/2015 | Black | G06T 5/008 348/187 |
| 2016/0021352 A1* | 1/2016 | Rudoy | H04N 9/735 348/223.1 |
| 2016/0366386 A1* | 12/2016 | Douady-Pleven | G06T 3/4015 |

OTHER PUBLICATIONS

Invitation to Pay Additional Fees from PCT/US2016/047873, dated Nov. 4, 2016, Apple Inc., pp. 1-6.

* cited by examiner

100

| block 102A<br>R pixel | block 102B<br>Gr pixel | block 102E<br>R pixel | block 102F<br>Gr pixel | ... |
|---|---|---|---|---|
| block 102C<br>Gb pixel | block 102D<br>B pixel | block 102G<br>Gb pixel | block 102H<br>B pixel | |
| block 102I<br>R pixel | block 102J<br>Gr pixel | block 102M<br>R pixel | block 102N<br>Gr pixel | |
| block 102K<br>Gb pixel | block 102L<br>B pixel | block 102O<br>Gb pixel | block 102P<br>B pixel | |
| ... | | | | ... |

| block 902A<br><br>detection factor A | block 902B<br><br>detection factor B | block 902C<br><br>detection factor C | . . . | |
|---|---|---|---|---|
| block 902D<br><br>detection factor D | block 902E<br><br>detection factor E | block 902F<br><br>detection factor F | | |
| block 902G<br><br>detection factor G | block 902H<br><br>detection factor H | block 902I<br><br>detection factor I | | |
| . . . | | | . . . | |
| | | | | block 902N<br><br>detection factor N |

FIG. 9

AUTOMATIC COMPENSATION OF LENS FLARE

BACKGROUND

Portable electronic devices, such as mobile phones, typically include a miniaturized camera module that utilizes an image sensor to capture images. Image sensors may include a color filter that is configured to detect different wavelengths of light at different pixels of the image sensor. For example, a Bayer color filter may include red pixels (R), green pixels adjacent to the red pixels (Gr), blue pixels (B), and green pixels adjacent to the blue pixels (Gb). A lens flare may occur when stray rays of light from relatively flat incident angles (i.e., angles far from the optical axis of the camera) passes through multiple adjacent color filters before being detected, thereby producing an undesirable shift in the detected light color due to the combination of the adjacent filter colors by the stray light ray.

For example, a lens flare may occur when light from a source just outside the intended image frame (e.g., a lamp positioned at an angle towards the edge of a scene) enters the image sensor of a camera. Since the detected light signals from various pixel types of a color filter scheme are typically gained (i.e., magnified), the stray light corresponding to the lens flare also gets magnified in conventional image processing systems, thereby resulting in a purple blob, flare, glow, or haze near the edge of the image. These purple image artifacts are undesirable, however miniaturized cameras in mobile devices do not typically have enough physical space available for lens shades, thick bezels, or other external countermeasures.

SUMMARY

Systems and methods for automatic lens flare compensation are disclosed. In one embodiment, a hardware device for automatic lens flare compensation may include a non-uniformity detector implemented by one or more processors or circuitry configured to operate on pixel data for an image in an image sensor color pattern. The non-uniformity detector may detect a non-uniformity in the pixel data in a color channel of the image sensor color pattern. The non-uniformity detector may generate output that may include location and magnitude values corresponding to the non-uniformity detected in the pixel data of the image. In an embodiment, the hardware device may include a lens flare detector implemented by one or more processors or circuitry configured to determine, based at least on the location and magnitude values, whether the output of the non-uniformity detector corresponds to a lens flare in the image. In some embodiments, the lens flare detector may generate, in response to determining that the output of the non-uniformity detector corresponds to the lens flare, a representative map of the lens flare. In one embodiment, the hardware device may include a lens flare corrector implemented by one or more processors or circuitry configured to determine one or more pixel data correction values corresponding to the lens flare, and the lens flare corrector may apply the one or more pixel data correction values to the pixel data.

In an embodiment, the non-uniformity detector may be implemented in image signal processor (ISP) circuitry. In one embodiment, the image sensor color pattern may include a Bayer color pattern, and a color of the image sensor color pattern used to detect the non-uniformity may include green. In an embodiment, the system may include a non-uniformity filter configured to be stored in a storage structure connected to the non-uniformity detector, where the non-uniformity filter may include multiple non-uniformity detection values corresponding to the image sensor color pattern, and where the multiple non-uniformity detection values may be applied to the pixel data of the image. In one embodiment, the lens flare detector may be implemented in program instructions executable on a processor. In an embodiment, the lens flare corrector may be implemented in program instructions executable on a processor. In one embodiment, the system may include multiple masked pixels configured to detect light entering the image sensor from multiple angles that fall outside an image view of the image sensor. The multiple masked pixels may include blackout elements configured to block light from multiple angles near the optical axis and admit light from the multiple angles that fall outside the image view. In an embodiment, the lens flare detector may be configured to generate, in response to determining that the output of the non-uniformity detector corresponds to the lens flare, a representative map of the lens flare. In one embodiment, the lens flare detector may be configured to generate real-time image sensor orientation feedback data based on a comparison of multiple sequential representative maps. In another embodiment, the lens flare detector may be configured to select a best image from a series of related images based on a comparison of multiple representative maps generated by the lens flare detector for respective images of the series of related images.

In one embodiment, a method for image signal processing may include a non-uniformity detector implemented by one or more processors or circuitry configured to operate on pixel data for an image in an image sensor color pattern. The non-uniformity detector may detect a non-uniformity in the pixel data in a color channel of the image sensor color pattern. The non-uniformity detector may generate output that may include location and magnitude values corresponding to the non-uniformity detected in the pixel data of the image. In an embodiment, the method may include a lens flare detector implemented by one or more processors or circuitry configured to determine, based at least on the location and magnitude values, whether the output of the non-uniformity detector corresponds to a lens flare in the image. In some embodiments, the lens flare detector may generate, in response to determining that the output of the non-uniformity detector corresponds to the lens flare, a representative map of the lens flare. In one embodiment, the method may include a lens flare corrector implemented by one or more processors or circuitry configured to determine one or more pixel data correction values corresponding to the lens flare, and the lens flare corrector may apply the one or more pixel data correction values to the pixel data.

In one embodiment, a computing device for automatic lens flare compensation may include an image sensor connected to a sensor interface. The computing device may include a central processing unit, and a display connected to the central processing unit. Additionally, the computing device may include a system memory connected to the central processing unit. Furthermore, the computing device may include an image signal processor connected to the sensor interface and the central processing unit. The image signal processor may include a non-uniformity detector implemented by one or more processors or circuitry configured to operate on pixel data for an image in an image sensor color pattern. The non-uniformity detector may detect a non-uniformity in the pixel data in a color channel of the image sensor color pattern. The non-uniformity detector may generate output that may include location and magnitude values corresponding to the non-uniformity detected in the pixel data of the image. In an embodiment, the computing device may include a lens flare detector implemented by one or more processors or circuitry configured to determine, based at least on the location and magnitude values, whether the output of the non-uniformity detector corresponds to a lens flare in the image. In some embodiments, the lens flare detector may generate, in response to determining that the output of the non-uniformity detector corresponds to the lens flare, a representative map of the lens flare. In one embodiment, the computing device may include a lens flare corrector implemented by one or more processors or circuitry configured to determine one or more pixel data correction values corresponding to the lens flare, and the lens flare corrector may apply the one or more pixel data correction values to the pixel data.

BRIEF DESCRIPTION OF THE DRAWINGS

FIG. 1 is a logical block diagram illustrating an example Bayer color filter mosaic for automatic lens flare compensation, according to some embodiments.

FIG. 9 is a logical block diagram illustrating an example green non-uniformity (GNU) filter for automatic lens flare compensation, according to some embodiments.

Figure 2:
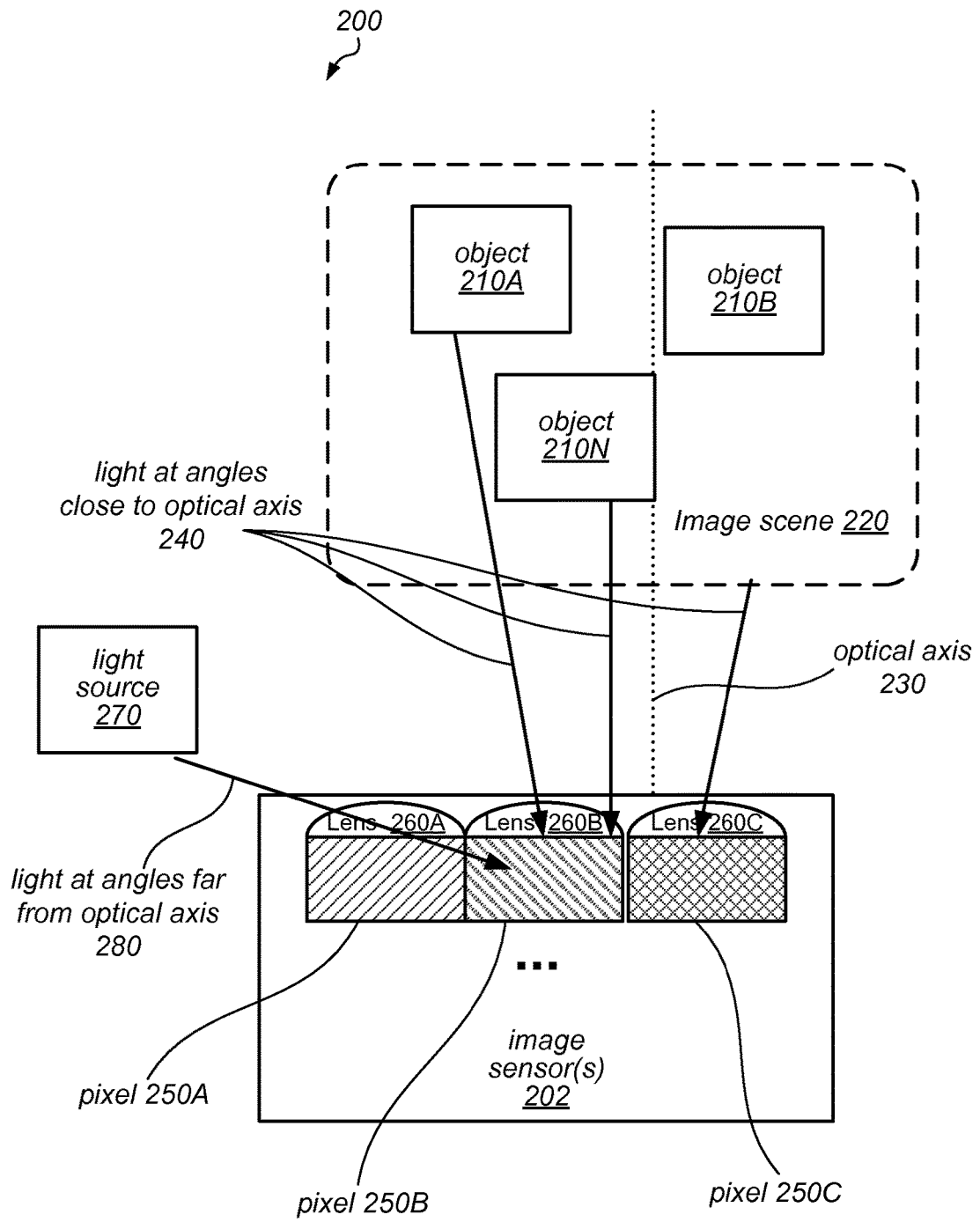
FIG. 2 is a logical block diagram illustrating an example system for automatic lens flare compensation, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

"Or." When used in the claims, the term "or" is used as an inclusive or and not as an exclusive or. For example, the phrase "at least one of x, y, or z" means any one of x, y, and z, as well as any combination thereof.

DETAILED DESCRIPTION

An image signal processor (ISP) or other image processing pipeline may implement many different techniques or components to correct or enhance image data captured by an image sensor. Stray light rays from sources far from the optical axis of an image sensor may create a lens flare, which may appear as a purple blob, haze, or glow, in an image. In various pixel color filter array schemes, at least a portion of the lens flare may include a non-uniformity. For example, in a Bayer color filter array system, the non-uniformity may be a green non-uniformity (GNU) between the green pixels adjacent to red pixels (i.e., the Gr pixels) vs. the green pixels adjacent to blue pixels (i.e., the Gb pixels), while in other color filtering systems the non-uniformity may correspond to one or more other wavelengths of light (i.e., other colors). In an embodiment, the correlation between the non-uniformity and the lens flare may be used as a means to discriminate between the flare and the desired scene content. Hardware modules, such as solid state circuits, are well suited for lens flare compensation since every pixel within an image may be efficiently analyzed via digital means to detect non-uniformity data. In one embodiment, one or more hardware module(s), such as an image signal processor, may perform the computationally-intensive steps of automatic lens flare detection and/or compensation in order to reduce lens flare effects in images. In an embodiment, the hardware module(s) may interface with a software application that provides further processing of the non-uniformity data (e.g., darkening or desaturation to reduce the appearance of residual flare after initial processing).

In one embodiment, a non-uniformity correction module may include an intermediate ISP stage that interfaces with software algorithms and/or hardware modules to compensate for lens flares during image processing. In an embodiment, a non-uniformity filter may be applied to the green pixels of the image sensor to estimate the local non-uniformity (e.g., to calibrate a non-uniformity correction module), and the correlation between the non-uniformity filter output data and data corresponding to the signal magnitude (i.e., strength) of a lens flare may be used to selectively subtract out the effects of one or more lens flares, thereby improving image quality. In one embodiment, linear filtering operations may be used to estimate the local green non-uniformity and output a representative map, such as a thumbnail image, that highlights any non-uniformities of an image. The ISP may then use the representative map of the non-uniformity as a guide for other processing to subtract out (i.e., reduce or remove) a significant portion of the lens flare, before passing the image data to a demosaic stage and/or a color correction stage for further processing. In another embodiment, the region around the lens flare may be treated with other means, such as darkening or desaturation via a software application as well as removing the non-uniformity, to reduce the appearance of any residual flare after initial processing.

In various embodiments, the image signal processor may process image data in an image processing pipeline at multiple rates in order to conserve system bandwidth and more efficiently leverage the processing capabilities of the image processing pipeline. For instance, in at least some embodiments one or more front-end pipeline stages may process image data at an initial rate, such as 2 pixels per clock cycle (ppc). In this way large amounts of image data (e.g., either as large individual image frames or a high rate of image frames, such as may be captured when recording slow motion video) may receive initial processing to reduce or correct image signal noise, artifacts, and other image defects that may be introduced as a result of collecting and processing image data. The image data may then be downscaled to a desired size and processed at a different rate, such as 1 ppc, at one or more back-end pipeline stages to perform other operations on the image frames in order to reduce image signal noise, correct color and image defects, as well as apply various special effects, so that processing is not performed upon image data that may be discarded.

In at least some embodiments, image data captured and processed through front-end pipeline stages may be stored in raw or full-color formats to a memory, while a scaled version of the image data may continue to be processed through the back-end pipeline stages of the image processing pipeline. In this way, high-resolution versions of image frames with some image processing may be captured while simultaneously continuing processing for lower resolution versions of the image frames (e.g., capturing high resolution stills of image frames that are also recorded in a lower resolution video).

In at least some embodiments, a back-end interface may be implemented to allow image data collected from sources different than the image sensor to be processed through back-end pipeline stage(s) of the image processing pipeline. For instance, image data received at a device that implements the image processing pipeline (e.g., a mobile computing device) from a remote device (e.g., a content server of a content provider, such as a web-based video service) may be received via the back-end interface and processed through the back-end pipeline stage(s) in order to perform operations to reduce image signal noise, correct color and image defects, or apply various special effects. In this way, the dedicated image processing components of the image processing pipeline may be utilized to efficiently perform image processing for image data received from many other sources.

The techniques described herein for automatic lens flare compensation in image data may be further illustrated in terms of an example system that employs them. As noted above, these techniques may be implemented in any type of camera, apparatus, or computing system that includes the capability to capture and process image data, including video clips.

FIG. 1 is a logical block diagram illustrating an example sensor color filter mosaic 100 (sometimes referred to as a color filter array (CFA)) for automatic lens flare compensation, according to some embodiments. In an embodiment, sensor color filter mosaic 100 may include multiple blocks 102A-n, n being a natural number, where each block corresponds to a pixel of an input image. In some embodiments, pixel data may include an image sensor color pattern. An image sensor color pattern may be based on one or more color channels. In an embodiment, the pixels corresponding to the sensor color filter mosaic 100 may be configured in a Bayer filter mosaic pattern. For example, a first row may include alternating red (R) and green (Gr) pixels, a second row may include alternating green (Gb) and blue (B) pixels, and the third and fourth rows may repeat the pattern to match the first and second rows, respectively. The color filters may thus be configured to detect light of various colors corresponding to particular regions of an input image. In an embodiment, sensor color filter mosaic 100 may be implemented as one or more physical structures within image sensor modules, such as image sensor(s) 202 and image sensor(s) 302 of FIG. 2 and FIG. 3, respectively, which are discussed below. Note that in other embodiments, the functions described with respect to FIGS. 2-12 below may be implemented using different types of color filter arrays (i.e., the color filters described herein are not limited to Bayer color filter schemes).

FIG. 2 is a logical block diagram illustrating an example system 200 for automatic lens flare compensation, according to some embodiments. In an embodiment, system 200 may include one or more object(s) 210A-N within a desired image scene 220. In one embodiment, image scene 220 may be located at a normal angle in relation to a camera that includes image sensor(s) 202, and a virtual optical axis 230 may be defined as extending perpendicularly from a surface of image sensor(s) 202 to image scene 220, such that light at angles close to the optical axis 240 may travel from image scene 220 and be detected by image sensor(s) 202, thereby enabling the front-end stages of an image signal processor, such as ISP 306 of FIG. 3 which is discussed below, to generate an input image of image scene 220. In one embodiment, image sensor(s) 202 may include multiple light sensitive pixels 250A-N, each of which may include a lens 260A-N (often called a "micro-lens") configured to direct light at angles close to the optical axis 240 from image scene 220 into pixels 250A-N for detection. In an embodiment, a Bayer color filter mosaic, such as Bayer color filter mosaic 100, may be included between lenses 260A-N and pixels 250A-N. In one embodiment, system 200 may include one or more light sources, such as light source 270, which may be located near the periphery/edge of image scene 220 or outside image scene 220. In various embodiments, light sources 270 may correspond to light emitting devices, reflections, natural sunlight, or colored surfaces. In an embodiment, light source 270 may emit light at angles far from the optical axis 280, which may sometimes be referred to as stray light. The light at angles far from the optical axis 280 may be at an angle that enables the light to interact with multiple color filters (e.g., the color filters of pixel 250A and pixel 250B). The stray light may thus ultimately be detected as having an artificial color (e.g., ends up in a green pixel after going through a red filter) after entering image sensor(s) 202 at an off-axis angle and interacting with at least one color filter associated with a pixel different than the one the light ends up in. The artificial color acquired by the detected stray light may sometimes be referred to as adjacent filter bias. For example, light at angles far from the optical axis 280 may be detected as a lens flare in an input image. Lens flares are undesirable image artifacts, so it is thus useful for a hardware module, such as non-uniformity correction module 720 of FIG. 7 which is discussed below, and/or software, such as program instructions 336 of FIG. 3 which is discussed below, to be configured to be able to automatically compensate for the lens flare by adjusting one or more attributes of the input image. In an embodiment, image sensor(s) 202 may be configured similarly to image sensor(s) 302 of FIG. 3, which is discussed below.

Lens flare may result in a non-uniformity in a region corresponding to multiple pixels of an input image that may exhibit a colored "checkerboard" pattern, where the detected intensities of nearby pixels exhibit alternating magnitude values at a frequency corresponding to the frequencies in the color filter array system. For example, in a Bayer color filter system, a lens flare may in some embodiments be detected and estimated based on a green non-uniformity and a checkerboard pattern in the two types of green pixel and a pronounced purple tint in a region of the input image caused by the stray light interacting with multiple pixels and the different gains applied to the different color channels. In an embodiment, a high-pass filter may be implemented by a processing stage of an image signal processor, such bayer processing stage 506 of image signal processor 306 as discussed below, to detect and estimate the pixel-level granularity of a non-uniformity in image data. A system for automatic lens flare compensation may thus use a correlation between a non-uniformity and a lens flare to discriminate between a lens flare and natural (i.e., desirable) image scene content. In one embodiment, the strength of a checkerboard pattern may be used as a factor by an image signal processor module, such as non-uniformity correction module 720 described with respect to FIG. 7 below, to determine a non-uniformity adjustment amount in one or more regions of an image. For example, a hardware module and/or software may be configured to perform further processing in a respective region to correct a lens flare if a strong checkerboard pattern is detected in that region.

Figure 3:
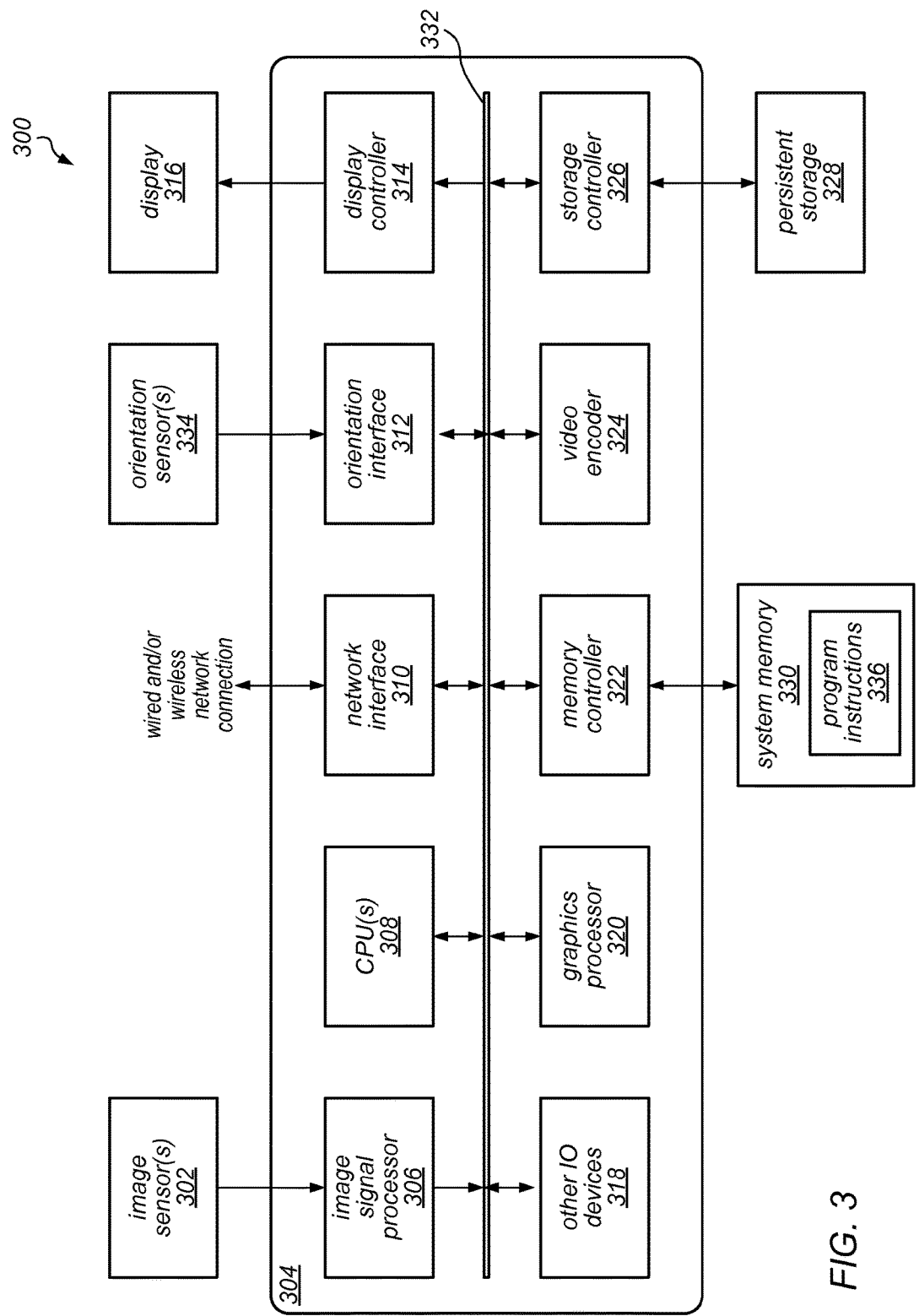
FIG. 3 is a logical block diagram illustrating an example system for automatic lens flare compensation, according to some embodiments.

One example of a system that is configured to implement any or all of the techniques described herein is illustrated in FIG. 3. For example, system 300 illustrated in FIG. 3 may be configured to perform image processing using an image signal processor without the additional system memory operations required by existing GPU and CPU approaches. In the illustrated embodiment, system 300 includes image sensor(s) 302, a system-on-a chip (SOC) component 304, system memory (e.g., dynamic random access memory (DRAM)) 330, persistent storage (e.g., flash memory) 328, and a display 316 (e.g., a liquid crystal display (LCD)). In this example, image sensor(s) 302 may be any type of image sensor suitable for capturing image data (e.g., an image sensor that is responsive to captured light), such as an active-pixel sensor (e.g., complementary metal-oxide-semiconductor (CMOS) active-pixel sensor) on a camera, video camera, or other device that includes a camera or video camera. In this example, display 316 may be configured to display a preview of captured still images or video clips (which may be provided as output from image signal processor 306). Display 316 may also be configured to display menus, selected operating parameters, or other information received from a user interface of the system (not shown). In other embodiments, other types of display devices may be included in the system for these purposes. In different embodiments, system 300 may be any of various types of devices, including, but not limited to, a personal computer system; a desktop computer; a laptop computer; a notebook, tablet, slate, or netbook computer; a mainframe computer system; a handheld computer; a workstation; a network computer; a camera; a set top box; a mobile device, such as a mobile phone, pager, personal data assistant (PDA), tablet device, or music player; an I/O device such as a digital camera, a scanner, a video recorder; a consumer device; a video game console; a handheld video game device; or in general any type of computing or electronic device that includes the functionality of a camera or video camera.

In this example, the SOC component 304 includes an image signal processor (ISP) 306, a central processor unit (CPU) 308, a network interface 310, orientation interface 312 (which may be coupled to orientation sensor(s) 334 from which system 300 orientation data, such as motion data, may be gathered), a display controller 314 (which may be coupled to and control the operations of display 316), a graphics processor unit (GPU) 320, memory controller 322 (which is coupled to system memory 330), a video encoder 324, a storage controller 326 (which is coupled to and controls access to persistent storage 328, such as flash memory or other non-volatile random access memory), and various other I/O devices (shown as 318), any or all of which may communicate with each other over interconnect 332. In some embodiments, system 300 or SOC component 304 may include more or fewer elements than those shown in FIG. 3.

In various embodiments, SOC component 304 may be a uniprocessor system including one processor, or a multiprocessor system including several processors (e.g., two, four, eight, or another suitable number). CPU(s) 308 may implement any suitable instruction set architecture, and may be configured to execute instructions defined in that instruction set architecture. For example, in various embodiments CPU(s) 308 may be general-purpose or embedded processors implementing any of a variety of instruction set architectures (ISAs), such as the x86, PowerPC, SPARC, RISC, or MIPS ISAs, or any other suitable ISA. In multiprocessor systems, each of CPU(s) 308 may commonly, but not necessarily, implement the same ISA. CPU 308 may employ any microarchitecture, including scalar, superscalar, pipelined, superpipelined, out of order, in order, speculative, non-speculative, etc., or combinations thereof. CPU 308 may include circuitry to implement microcoding techniques. CPU 308 may include one or more processing cores each configured to execute instructions. CPU 308 may include one or more levels of caches, which may employ any size and any configuration (set associative, direct mapped, etc.).

In the example illustrated in FIG. 3, system memory 330 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit implementing system 300 in a chip-on-chip configuration, a package-on-package configuration, or a multi-chip module configuration. In some embodiments, system memory 330 may store pixel data or other image data or statistics in various formats. Similarly, while the example system 300 illustrated in FIG. 3 includes persistent storage 328 for non-volatile storage of image data or other data used in the system, in other embodiments, the system may include other types of non-volatile memory (e.g. read-only memory (ROM)) for those purposes. In an embodiment, system memory 330 may include data, such as a program instructions 336, and/or one or more representative maps used by image signal processor 306 to identify, process, and thereby compensate for green non-uniformities in image data.

Graphics processing unit (GPU) 320 may include any suitable graphics processing circuitry. Generally, GPU 320 may be configured to render objects to be displayed into a frame buffer (e.g., one that includes pixel data for an entire frame). GPU 320 may include one or more graphics processors that may execute graphics software to perform a part or all of the graphics operation, or hardware acceleration of certain graphics operations. The amount of hardware acceleration and software implementation may vary from embodiment to embodiment.

I/O devices 318 may include any desired circuitry, depending on the type of system 300. For example, in one embodiment, system 300 may be a mobile computing device (e.g. personal digital assistant (PDA), tablet device, smart phone, etc.) and the I/O devices 318 may include devices for various types of wireless communication, such as WiFi, Bluetooth, cellular, global positioning system, etc. In some embodiments, I/O devices 318 may also include additional storage, including RAM storage, solid state storage, or disk storage. In some embodiments, I/O devices 318 may include user interface devices such as additional display devices, including touch display screens or multi-touch display screens, keyboards, keypads, touchpads, scanning devices, voice or optical recognition devices, microphones, speakers, scanners, printing devices, or any other devices suitable for entering or accessing data by or within system 300.

In this example, image signal processor (ISP) 306 may include dedicated hardware that may facilitate the performance of various stages of an image processing pipeline, as described in detail herein. In some embodiments, ISP 306 may be configured to receive image data from image sensor(s) 302 via an image sensor interface, and to the process the data into a form that is usable by other components of system 300 (including display 316 or video encoder 324). In some embodiments, ISP 306 may be configured to perform various image-manipulation operations such as image translation operations, horizontal and vertical scaling, green non-uniformity correction, GNU filtering, GNU reduction, color space conversion or other non-warping image editing operations, or image stabilization transformations, as described herein. One embodiment of an image signal processor is illustrated in more detail in FIG. 3 and described below.

In the example illustrated in FIG. 3, interconnect 332 may be configured to facilitate communications between the various functional units included in SOC 304. In various embodiments, interconnect 332 may include any suitable interconnect circuitry such as meshes, network on a chip fabrics, shared buses, point-to-point interconnects, etc. In some embodiments, interconnect 332 may perform any necessary protocol, timing or other data transformations to convert data signals from one component (e.g., system memory 330) into a format suitable for use by another component (e.g., CPU(s) 308 or GPU 320). In some embodiments, interconnect 332 may include support for devices attached through various types of peripheral buses, such as a variant of the Peripheral Component Interconnect (PCI) bus standard or the Universal Serial Bus (USB) standard, for example. In some embodiments, the function of interconnect 332 may be split into two or more separate components, such as a north bridge and a south bridge, for example. In some embodiments, interconnect 332 may facilitate the communication of pixel data or other image data or statistics to various functional units in the appropriate formats.

In this example, network interface 310 may be configured to allow data to be exchanged between system 300 and other devices attached to one or more networks (e.g., carrier or agent devices) or between nodes or components of system 300. For example, video or other image data may be received from other devices (e.g., a content provider network or another mobile computing device) via network interface 310 and be stored in system memory 330 for subsequent processing (e.g., via a back-end interface to image signal processor 306, such as discussed below in FIG. 3) and display. The network(s) may in various embodiments include, but are not limited to, Local Area Networks (LANs) (e.g., an Ethernet or corporate network), Wide Area Networks (WANs) (e.g., the Internet), wireless data networks, some other electronic data network, or some combination thereof. In various embodiments, network interface 310 may support communication via wired or wireless general data networks, such as any suitable type of Ethernet network, for example; via telecommunications/telephony networks such as analog voice networks or digital fiber communications networks; via storage area networks such as Fibre Channel Storage Area Networks (SANs), or via any other suitable type of network or protocol.

Those skilled in the art will appreciate that system 300 is merely illustrative and is not intended to limit the scope of embodiments. For example, system 300 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available. In some embodiments program instructions stored in system memory 330 may be executed by CPU 308 or GPU 320 to provide various functions of system 300.

In other embodiments, various functions may be performed by software components executing in memory on another device and communicating with the illustrated system via inter-computer communication. Some or all of these software components or any data structures described herein may be stored (e.g., as instructions or structured data) in system memory 330, in persistent storage 328, or may be stored on a non-transitory computer-readable medium or a portable article to be read by an appropriate drive. In some embodiments, instructions stored on a computer-accessible medium separate from system 300 may be transmitted to system 300 via transmission media or signals such as electrical, electromagnetic, or digital signals, conveyed via a communication medium such as a network or a wireless link. Various embodiments may further include receiving, sending or storing instructions or data implemented in accordance with the descriptions herein. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc.

Figure 4:
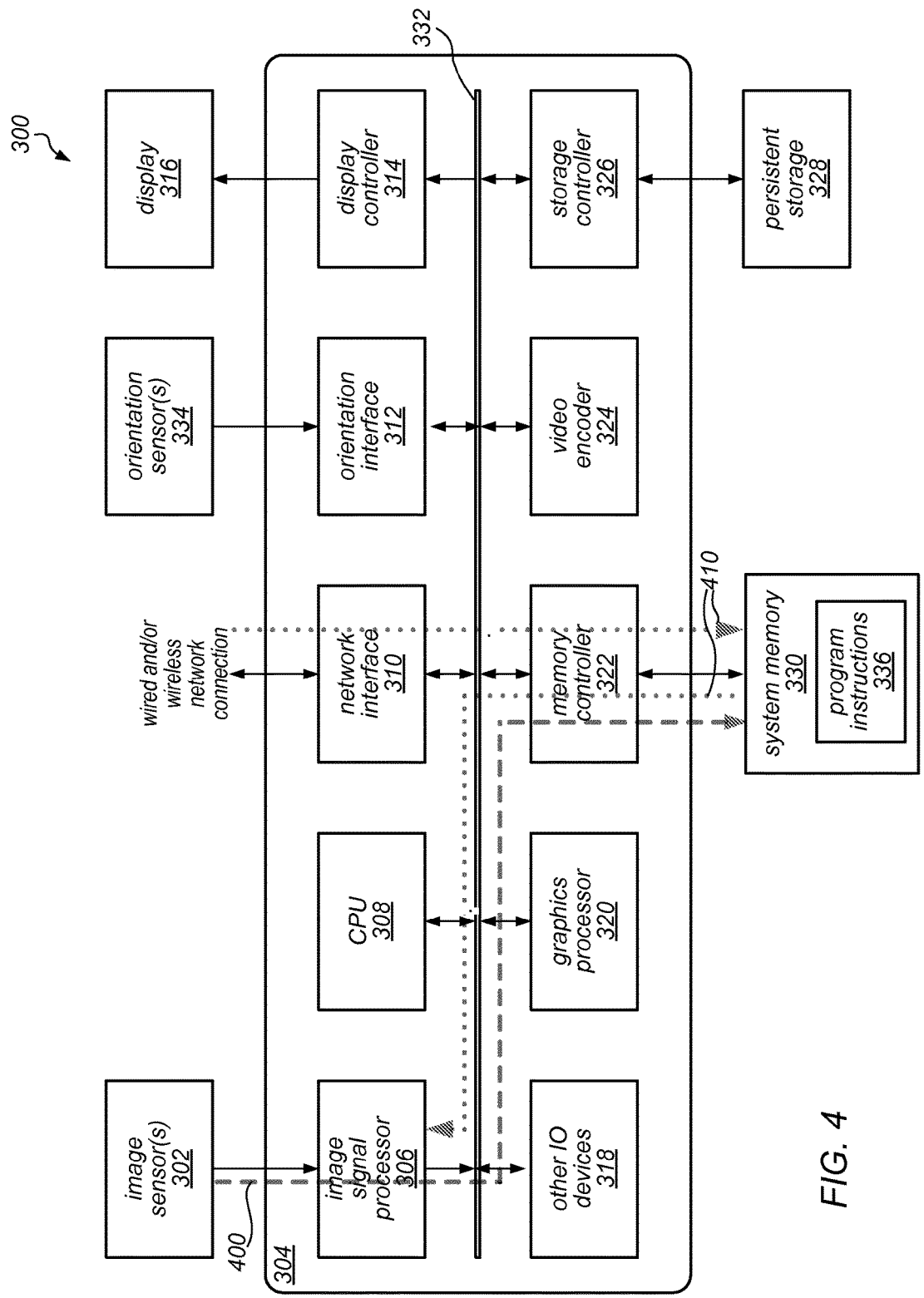
FIG. 4 is a logical block diagram illustrating example data paths in a system for automatic lens flare compensation, according to some embodiments.

FIG. 4 is a block diagram illustrating data paths in a system that implements an image signal processor (specifically, in system 300 illustrated in FIG. 3), according to some embodiments. As illustrated by the dashed lines 400, in one example image data may pass from the image sensor (302) via an image sensor interface, through the image signal processor (306) to system memory 330 (by way of interconnect 332 and memory controller 322). Once the image data has been stored in system memory 330, it may be accessed by video encoder 324, display 316 (e.g., by way of interconnect 332 and, in the case of display 316, display controller 314). For example, it may be accessed by display controller 314 in order to display a preview on display 316, or may be accessed by video encoder 324, which may encode the data in a format suitable for video recording to persistent storage 328 (e.g., for storage), or for passing the data to network interface 310 for transmission over a network (e.g., for a video conference) or elsewhere, in various embodiments.

Another example data path is illustrated by the dotted lines 410. Image data, such as video image or data or image stills or frames, may be received system 300 from sources other than the image sensor(s) 302. In one embodiment, image data may be received by image signal processor 306 from system memory 330. In another embodiment, video data may be streamed, downloaded, or otherwise communicated to the system 300 via wired or wireless network connections from other sources remote to system 300 (e.g., a content provider network or other mobile computing device). The image data may be received via network interface 310 and written to system memory 330 via memory controller 322. The image data may then be obtained by image signal processor 306 from system memory 330 and processed through one or more image processing pipeline stages, in some embodiments, to perform various image correction, translation, conversion, or other image processing techniques. The image data may then be returned to system memory 330, video encoder 324, or other component such as display controller 314 for display at display 316 or to storage controller 326 for storage at persistent storage 328 (not illustrated).

In some embodiments graphics processor 320 may access, manipulate, transform or otherwise process image data, and thus additional read and write operations may be performed on system memory 330 beyond those illustrated in FIG. 4. Image data that is stored in system memory 330 may be accessed by GPU 320 (by way of interconnect 332 and memory controller 322), and, after GPU 320 has performed one or more image transformations on the image data, the image data may be written back to system memory 330 (again, by way of interconnect 332 and memory controller 322). Similar data paths may be employed in system 300 between system memory 330 and CPU 308 if image processing is instead performed by CPU 308 (e.g., by software executing on CPU 308). In some embodiments (though not illustrated) image data out from image signal processor 306 may be sent directly (via interconnect 332) to another functional component (e.g., CPU 308, graphics processor 320, other I/O devices 318, network interface 310, video encoder 324, storage controller 326, or display controller 314) without storing the image data to system memory 330.

Figure 5:
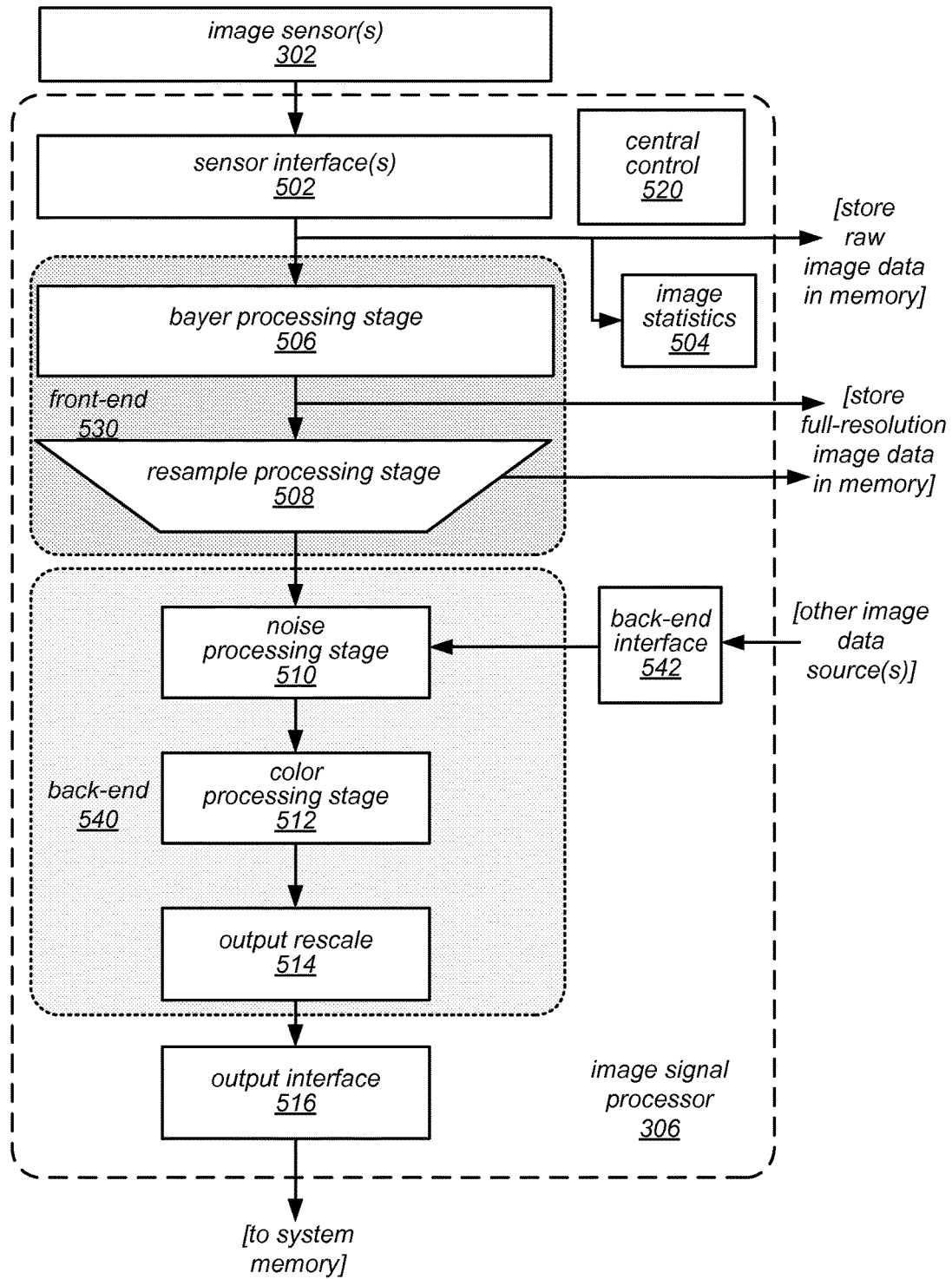
FIG. 5 is a logical block diagram illustrating an example image signal processor, according to some embodiments.

One embodiment of an ISP, such as image signal processor 306, is illustrated by the block diagram in FIG. 5. As illustrated in this example, ISP 306 may in various embodiments be connected to image sensor(s) 302 by image sensor interface(s) 502 (from which it receives image data). In this example, ISP 306 implements an image processing pipeline which may include a set of stages that process image information from creation, capture, or receipt to output. For example, the various elements illustrated as components of ISP 306 process raw pixel data received from image sensor(s) 302 through sensor interface(s) 502 into image data processable by other stages in the pipeline (e.g., image statistics 504, resample processing stage 508, noise processing stage 510, color processing stage 512, or output rescale 514), by other components of a system that includes ISP 306 via output interface 516 (including those that access the transformed data from the system memory after it is written to the system memory via memory controller 322 or are provided the image data via interconnect 332 directly) or back-end interface 542, or by other devices coupled to the system that includes ISP 306. In at least some embodiments, sensor interface(s) 502 may perform various preprocessing operations, such as pixel defect correction to detect and correct patterned defects and defect line pairs (e.g., created by special pixels like focus pixels), and image cropping or binning to reduce image data size. Note that in some embodiments, the image signal processor 306 is a streaming device. In other words, pixels may be received by the image signal processor 306 from the image sensor(s) 302 via sensor interface(s) 502 in raster order (i.e., horizontally, line by line) and may in general be processed through its various pipeline stages in raster order, until finally being output in raster order.

In an embodiment, sensor interface(s) 502 may be configured to save an initial version of raw pixel data corresponding to an input image received from image sensor(s) 302 in system memory 330, thereby preserving a version of the raw pixel data for processing by the software (i.e., optionally preserving a snapshot of the raw pixel data in memory before the front-end 530 or back-end 540 stages of ISP 306 process the image data).

Image signal processor 306 may process image data received at an ISP at different rates. For example, in the embodiment illustrated in FIG. 5, image signal processor may implement one or more front-end pipeline stages 330, such as Bayer processing stage 506 and resample processing stage 508, which process raw pixel data (e.g., image sensor color patterns of one or more select color channels) at an initial rate. Thus, the various different techniques, adjustments, modifications, or other processing operations performed at these front-end pipeline stages (such as those described below with respect to Bayer processing stage 506 and resample processing stage 508) may be implemented so that the image data may be continuously processed through these stages at the initial rate. For example, if the front-end pipeline stages 330 process 2 pixels per clock cycle, then Bayer processing stage 506 operations like black level compensation, highlight recovery, defective pixel correction, and others, may process 2 pixels of image data at a time. In an embodiment, different modules within ISP 306 may process image data at different rates. For example, modules in the front-end of ISP 306 may process data at an initial rate, while modules towards the back-end of ISP 306 may process image data at a reduced rate.

In addition to processing the image data at front-end pipeline stages at an initial rate, image signal processor 306 may implement one or more back-end pipeline stages 540 that process image data a different rate. The back-end pipeline stages 540 may, in various embodiments, process image data at a reduced rate that is less than the initial data rate. For example, as illustrated in FIG. 5, back-end pipeline stages 540, such as noise processing stage 510, color processing stage 512, and output rescale 514, may be implemented so that the image data is processed according to the reduced rate. Given the above example of front-end stages 530 processing image data at 2 ppc, then noise processing stage 510 may implement operations such as temporal filtering and luma sharpening to process image data at a rate less than 2 ppc, such as 1 ppc.

In at least some embodiments, image signal processor 306 may implement back-end interface 542. Back-end interface 542 may receive image data from other image sources than image sensor(s) 302. For instance, as illustrated in FIG. 4, image data received over a wireless connection may be received and stored in system memory 330. The image data may be received through back-end interface 542 for processing at back-end stages 540 of image signal processor 306. In this way, image signal processor 306 can be configured to provide resource efficient image processing capacity to data received from other image data source(s) instead of (or in addition to) CPU or GPU processing performed on the image data. In various embodiments, back-end interface 542 may convert image data to a format that is utilized by back-end processing stages.

In various embodiments, image signal processor 306 may implement central control 520. Central control 520 may configure and start the processing of image data, in some embodiments. For example, central control module 520 may implement performance monitors for logging clock cycles, memory latency, quality of service, and state information. Central control module 520 may update or manage control parameters for units, modules, stages, or other components of ISP 306, and may interface with sensor interface 302 to control the starting and stopping of the units, modules, stages, or other components. For example, central control module 520 may interface with Bayer processing stage 506 to provide input data, such configuration data corresponding to a programmable (i.e., adjustable) non-uniformity filter, to provide commands from program instructions 336, to adjust one or more dynamic control parameters, and/or to receive output image data that may be sent to other ISP stages. In other examples, central control module 520 may configure image signal processor 306 to store image data (e.g., to be written to a memory, such as system memory 330 in FIG. 4) before, during, or after and resample processing stage 508. In this way full-resolution image data whether in raw or full-color domain format may be stored in addition to or instead of processing the image data output from and resample processing stage 508 through back-end pipeline stages. In an embodiment, central control module 520 may access data stored in registers and/or system memory 330, such a non-uniformity filter and program instructions 336, respectively.

In various embodiments, image signal processor 306 may implement image statistics module(s) 504. Image statistics module(s) 504 may perform various functions and collect information to be stored in a memory, such as system memory 330. For example image statistics module may, in some embodiments may perform sensor linearization, defective pixel replacement, black level compensation, lens shading correction, and inverse black level compensation in order to collect image information as a result of the various operations. Other statistics, such as 3A statistics (Auto white balance (AWB), auto exposure (AE), auto focus (AF)), histograms (e.g., 2D color or component), or any other image data information may be collected or tracked. Thus, the previous examples are not intended to be limiting. In some embodiments, certain pixels values, or areas of pixel values may be excluded from statistics collections, such as from AF statistics, when the statistics operations like sensor linearization, defective pixel replacement, black level compensation, lens shading correction, and inverse black level compensation identify clipped pixels. In scenarios where multiple image statistics modules 504 are implemented, each statistic module may be programmed by central control module 520 to collect different information for the same image data, or different image data collected for different images (e.g., collected from different ones of image sensor(s) 302).

As noted above, image signal processor 306 may implement one or multiple front-end pipeline stages, such as Bayer processing stage 506 and resample processing stage 508, which may process pixel image data in raw or full-color domains. Bayer processing stage 506 may, in various embodiments implement a variety of modules, units, or components to perform various operations, functions, or tasks on raw pixel data. Bayer raw format, for example, may be pixel image data from collected from image sensor(s) 302 that implement a Bayer pattern of pixel sensors. For instance, some pixel sensors only capture green light, while other sensors capture red or blue light in Bayer pattern of sensors. In this way, image data in Bayer raw image format (or other raw image format captured by a color filter array in an image sensor) provides pixel data with values specific to a particular color (instead of all colors).

Bayer processing stage 506 may thus process image data in a raw format (such as Bayer raw format) applying various operations including, but not limited to, sensor linearization, black level compensation, fixed pattern noise reduction, defective pixel correction, raw noise filtering, lens shading correction, white balance gain, and highlight recovery. A sensor linearization unit may, in some embodiments, map non-linear image data to linear space for other processing (e.g., to convert image data from a companding format collected from a High Dynamic Range (HDR) image sensor which may be one of image sensor(s) 302). Black level compensation may, in some embodiments, be performed to provide digital gain, offset and clip independently for each color component (e.g., Gr,R,B,Gb) on the pixels image data (which may occur after sensor linearization). In some embodiments, fixed pattern noise reduction may be performed to remove offset fixed pattern noise and gain fixed pattern noise by subtracting a dark frame from an input image and multiplying different gains to pixels, in some embodiments. Defective pixel correction may determine or identify defective pixels, and may replace defective pixel values, in various embodiments. Raw noise filtering may reduce noise of image data, in various embodiments, by averaging neighbor pixels that are similar in brightness. Highlight recovery may, in various embodiments, estimate pixel values for those pixels that are clipped (or nearly clipped) from other channels. Lens shading correction may apply a gain per pixel to compensate for a dropoff in intensity roughly proportional to a distance from a lens optical center. White balance gains may provide digital gains for white balance, offset and clip independently for all color components (e.g., Gr, R, B, Gb in Bayer format). Please note that various examples and descriptions provided above are not intended to be limiting as to the various techniques, components, or formats of Bayer processing stage 506 but are instead merely provided as examples. Various components, units, or modules may be broken apart into multiple different pipeline processing stages. Also note that in some embodiments, various ones of the components, units, or modules may convert raw image data into full-color domain, and thus Bayer processing stage 506 may, at various portions, process image data in the full-color domain in addition to or instead of raw image data. For instance, a simple demosaic unit may receive data from raw noise filtering and interpolate a full-color domain for raw image data to perform lens shading correction, white balance gain, or highlight recovery before converting the image data back to a raw image format.

In various embodiments, image signal processor 306 may implement Bayer processing stage 506. Note that the Bayer color filtering and/or processing scheme described is just one example. In various embodiments, image signal processor 306 and/or Bayer processing stage 506 may be configured to process pixel data corresponding to different color filtering and/or processing schemes. Bayer processing stage 506 may perform various operations to automatically correct or otherwise reduce the amount of lens flare in image data received from one or more sources, including image sensor (s) 302 (e.g., via Bayer processing stage 506), a memory (e.g., system memory 330), and/or a back-end stage (e.g., output interface 516), as discussed in further detail below with regard to FIG. 6. In one embodiment, Bayer processing stage 506 may provide output image data according to a reduced rate, such as may be implemented a back-end pipeline stages 540.

In various embodiments, image signal processor 306 may implement resample processing stage 508. Resample processing stage 508 may perform various operations to convert, resample, or scale image data received from Bayer processing stage 506, as discussed in further detail below with regard to FIG. 6, and may provide as output image data according to a reduced rate such as may be implemented a back-end pipeline stages 340. Please note, that in some embodiments, some or all of the portions of resample processing stage may be implemented as part of Bayer processing stage 506 and thus the previous description is provided as an example pipeline stages in an image processing pipeline which may implement automatic lens flare compensation in image data.

In various embodiments, image signal processor 306 may implement one or more back-end pipeline stages 540 to process image data at rate that is less than the initial rate for processing image data in front-end stages 530 (e.g., 4 ppc initial rate >3, 2, or 1 ppc reduced rate). In at least some embodiments, back-end pipeline stages 540 may process image data according to a particular full-color format (e.g., YCbCr 4:4:4 or RGB) in which Bayer processing stage 506 or back-end interface 542 may provide to back-end stages 540. Please note, that in some embodiments, various ones of the back-end stages 540 may be configured to convert image data to the particular full-color format (or may utilize different full-color formats for processing), and thus the previous example is not intended to be limiting.

Image signal processor 306 may implement noise processing stage 510, in some embodiments. Noise processing stage 510 may, in various embodiments implement a variety of modules, units, or components to perform various operations, functions, or tasks, in different orders, such as gamma/de-gamma mapping, color space conversion, temporal filtering, noise filtering, luma sharpening, and chroma noise reduction. Color space conversion may convert image data to another color format or space (e.g., RGB to YCbCr). Gamma mapping may provide non-linear mapping functions for particular color channels of pixel data (e.g., Y, Cb, and Cr channels) in order to apply different image effects, including, but not limited to, black and white conversion, sepia tone conversion, negative conversion, or solarize conversion). Temporal filtering may be performed, in various embodiments, to filter image signal noise based on pixel values from a previously filtered image frame. Pixel values from the previously filtered image frame (which may be referred to herein as the reference image frame), may be combined with pixel values of a current image frame to get a best estimate of the pixel values. For example, a temporal filter may average the pixel values in the current image frame and the corresponding pixels in the reference image frame when the current image frame and the reference image frame are similar. In at least some embodiments, temporal filtering may be performed upon individual color channel values. For instance, a temporal filter may filter Y color channel values (from image data in YCbCr format) with Y color channel values in the reference frame (without filtering on other channels like Cb or Cr).

Other noise filtering, such as spatial noise filtering may be performed. In at least some embodiments, luma sharpening and chroma suppression may be performed to as part of spatial noise filtering in simultaneous or near simultaneous fashion. Luma sharpening may sharpen luma values of pixel data, in some embodiments. Chroma suppression may attenuate chroma to gray (i.e. no color), in some embodiments. The aggressiveness of noise filtering may be determined differently for different regions of an image, in some embodiments. Spatial noise filtering may be included as part of a temporal loop implementing temporal filtering as discussed above. For example, a previous image frame may be processed by a temporal filter and a spatial noise filter before being stored as a reference frame for a next image frame to be processed. In other embodiments, spatial noise filtering may not be included as part of the temporal loop for temporal filtering (e.g., the spatial noise filter may be applied to an image frame after it is stored as a reference image frame and thus may not be a spatially filtered reference frame). Please note that various examples and descriptions provided above are not intended to be limiting as to the various techniques or components implemented as part of noise processing stage 510, but are instead merely provided as examples.

Image signal processor 306 may implement color processing stage 512, in some embodiments. Color processing stage 512 may, in various embodiments implement a variety of modules, units, or components to perform various operations, functions, or tasks, in different orders, such as local tone mapping, gain/offset/clip, color correction, three-dimensional color lookup, gamma conversion, and color space conversion. Local tone mapping may, in some embodiments, apply spatially varying local tone curves in order to provide more control when rendering an image. For instance, a two-dimensional grid of tone curves (which may be programmed by the central control module 520) may be bilinearly interpolated such that smoothly varying tone curves are created across an image. In some embodiments, local tone mapping may apply spatially varying and intensity varying color correction matrices, which may, for example, be used to darken highlights and brighten shadows in an image. Digital gain, offset and clip may be provided for each color channel or component of image data, in some embodiments. Color correction may be implemented, in some embodiments, applying a color correction transform matrix to image data. 3D color lookup may utilize a three dimensional array of color component output values (e.g., R, G, B) to perform advanced tone mapping, color space conversions, and other color transforms, in some embodiments. Gamma conversion may be performed, mapping input image data values to output data values in order to perform gamma correction, tone mapping, or histogram matching. Color space conversion may be implemented to convert image data from one color space to another (e.g., RGB to YCbCr). Other processing techniques may also be performed as part of color processing stage 512 to perform other special image effects, including black and white conversion, sepia tone conversion, negative conversion, or solarize conversion.

In various embodiments, image signal processor 306 may implement a back-end scaler module, such as output rescale module 514. Output rescale 514 may resample, transform and correct distortion on the fly as the ISP 160 processes image data. Output rescale 514 may compute a fractional input coordinate for each pixel and uses this fractional coordinate to interpolate an output pixel via a polyphase resampling filter, in some embodiments. A fractional input coordinate may be produced from a variety of possible transforms of an output coordinate, such as resizing or cropping an image (e.g., via a simple horizontal and vertical scaling transform), rotating and shearing an image (e.g., via non-separable matrix transforms), perspective warping (e.g., via an additional depth transform) and per-pixel perspective divides applied in piecewise in strips to account for changes in image sensor during image data capture (e.g., due to a rolling shutter), and geometric distortion correction (e.g., via computing a radial distance from the optical center in order to index an interpolated radial gain table, and applying a radial perturbance to a coordinate to account for a radial lens distortion). Output rescale 514 may provide image data via output interface 516 to various other components of system 300, as discussed above with regard to FIGS. 3 and 4.

Note also that, in various embodiments, the functionally of units 502-542 may be performed in a different order than the order implied by the order of these functional units in the image processing pipeline illustrated in FIG. 5, or may be performed by different functional units than those illustrated in FIG. 5. Moreover, the various components, units, processes, or other functionalities described in FIG. 5 (or subsequent FIGS. 6-12) may be implemented in various combinations of hardware or software.

Figure 6:
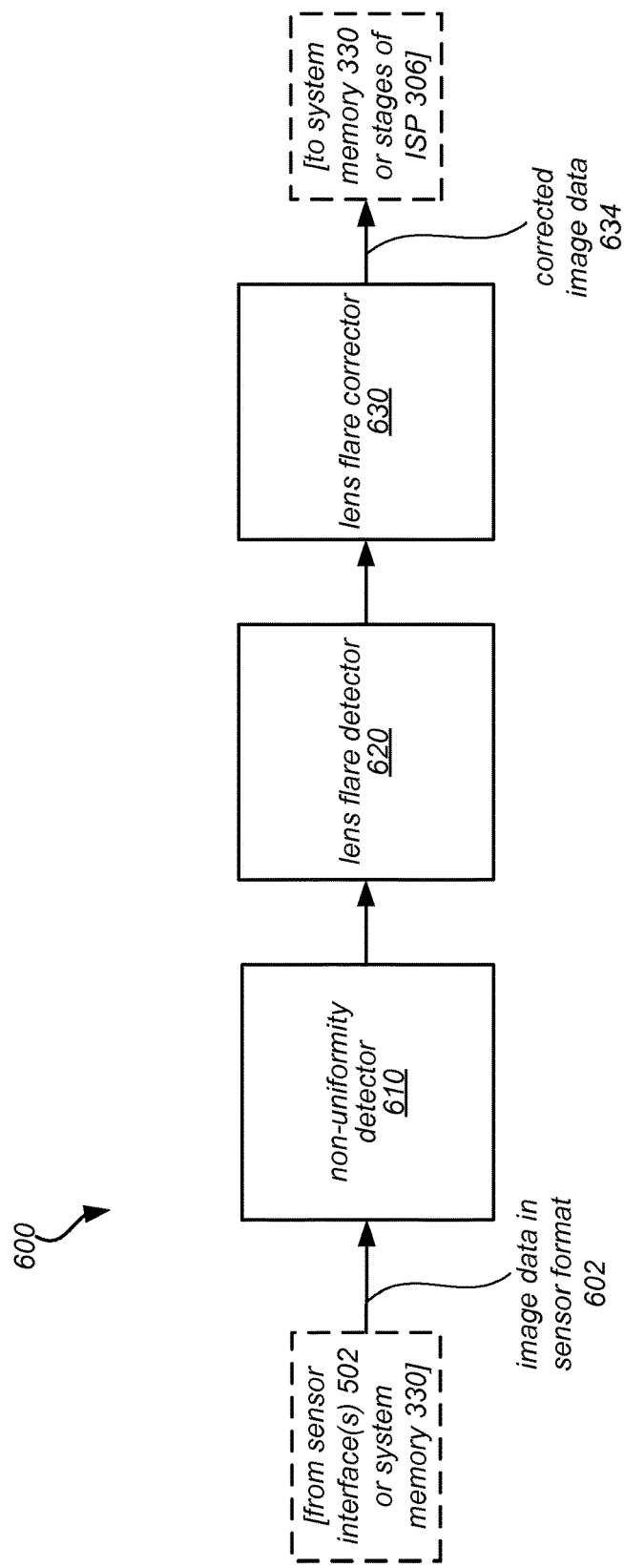
FIG. 6 is a logical block diagram illustrating a system for automatic lens flare compensation, according to some embodiments.

FIG. 6 is a logical block diagram illustrating an example system 600, according to some embodiments. In one embodiment, system 600 may include a non-uniformity detector 610 implemented by one or more processors or circuitry configured to receive input data, such as image data in sensor format 602, from image sensor interface(s) 502 and/or system memory 330. In various embodiments, image data in sensor format 602 may include raw pixel data, an image sensor color pattern, processed pixel data, image data in a color space format, or the like. In an embodiment, non-uniformity detector 610 may be configured to detect one or more non-uniformities in pixel data of an image sensor color pattern and to generate output that may include location (e.g., pixel identification values corresponding to non-uniformities and/or x,y coordinates corresponding to the position of a non-uniformity in an input image) and magnitude (e.g., strength) values corresponding to the detected non-uniformities. In one embodiment, non-uniformity detector 610 may be implemented in one or more hardware modules, such as Bayer processing stage 506 and/or non-uniformity correction module 720 of FIG. 7 below). In other embodiments, one or more portions of the functionality of non-uniformity detector 610 may be implemented in software, such as program instructions 336, configured to be executed by circuitry or one or more processors, such as CPU(s) 308 or graphics processor 320.

Figure 10:
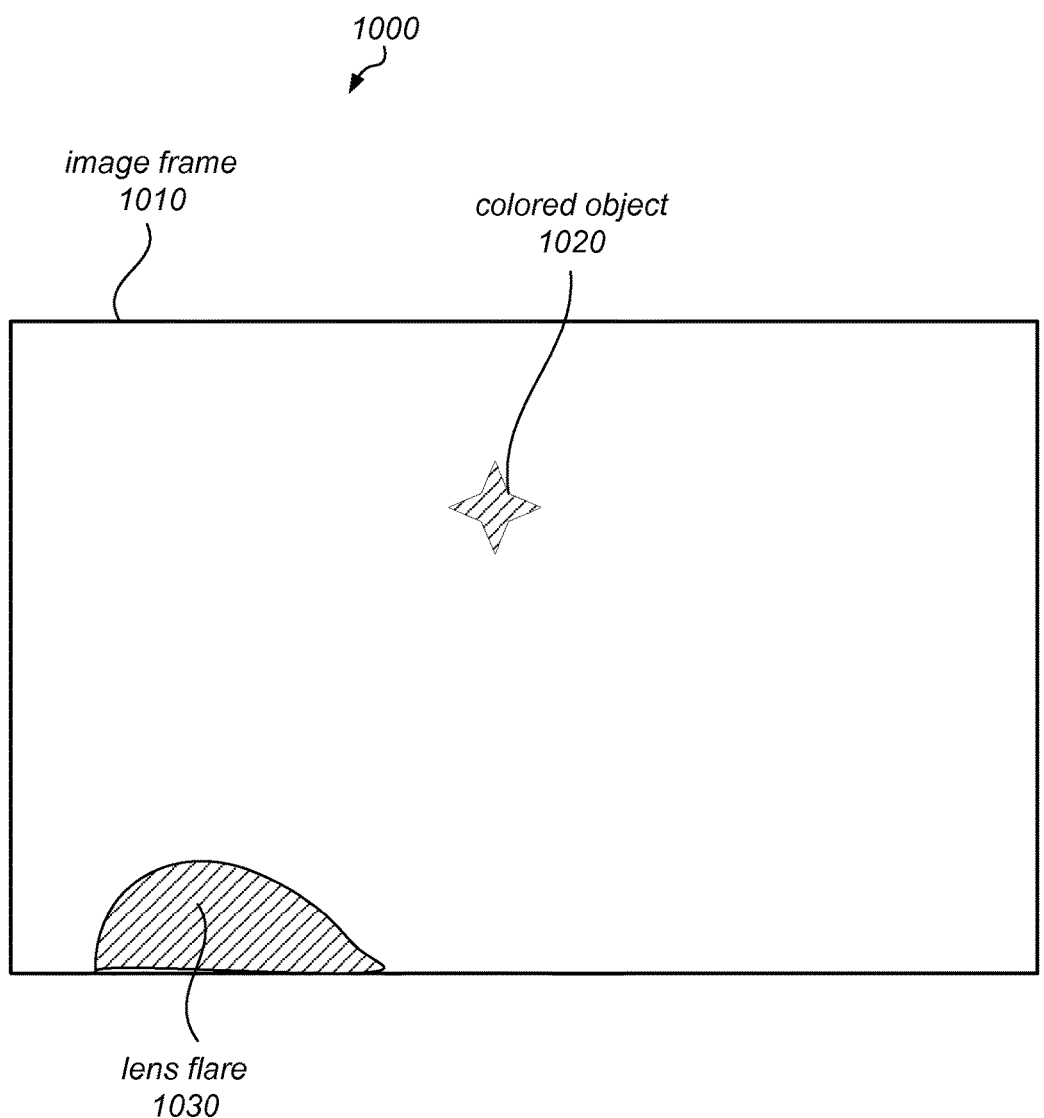
FIG. 10 is a logical block diagram illustrating an example representative map for automatic lens flare compensation, according to some embodiments.

In one embodiment, system 600 may include a lens flare detector 620 implemented by one or more processors or circuitry configured to use the location and magnitude values generated by the non-uniformity detector 610 to determine whether the output of the non-uniformity detector 610 corresponds to a lens flare in the input image. In an embodiment, lens flare detector 620 may be configured to generate a representative map, such as a thumbnail image, of one or more lens flares in response to determining that the detected non-uniformities correspond to one or more lens flares. An example of a representative map is illustrated in FIG. 10, which is discussed in further detail below. In one embodiment, lens flare detector 620 may be implemented in software, such as program instructions 336, configured to be executed by circuitry or one or more processors, such as CPU(s) 308 or graphics processor 320. In other embodiments, one or more portions of lens flare detector 620 may be implemented in one or more hardware modules, such as Bayer processing stage 506 and/or non-uniformity correction module 720 of FIG. 7 below).

In an embodiment, system 600 may include a lens flare corrector 630 implemented by one or more processors or circuitry configured to determine one or more pixel data correction values corresponding to the lens flare detected by lens flare detector 620 and to apply the one or more pixel data correction values to the pixel data, thereby at least partially removing the lens flare from the image data. In some embodiments, lens flare corrector 630 may use a representative map generated by lens flare detector 620 to assist in the determination of the one or more pixel data correction values and/or the application of the pixel data correction values to the pixel data. In one embodiment, lens flare corrector 630 may be implemented in software, such as program instructions 336, configured to be executed by circuitry or one or more processors, such as CPU(s) 308 or graphics processor 320. In other embodiments, one or more portions of lens flare corrector 630 may be implemented in one or more hardware modules, such as Bayer processing stage 506 and/or non-uniformity correction module 720 of FIG. 7 below).

Figure 7:
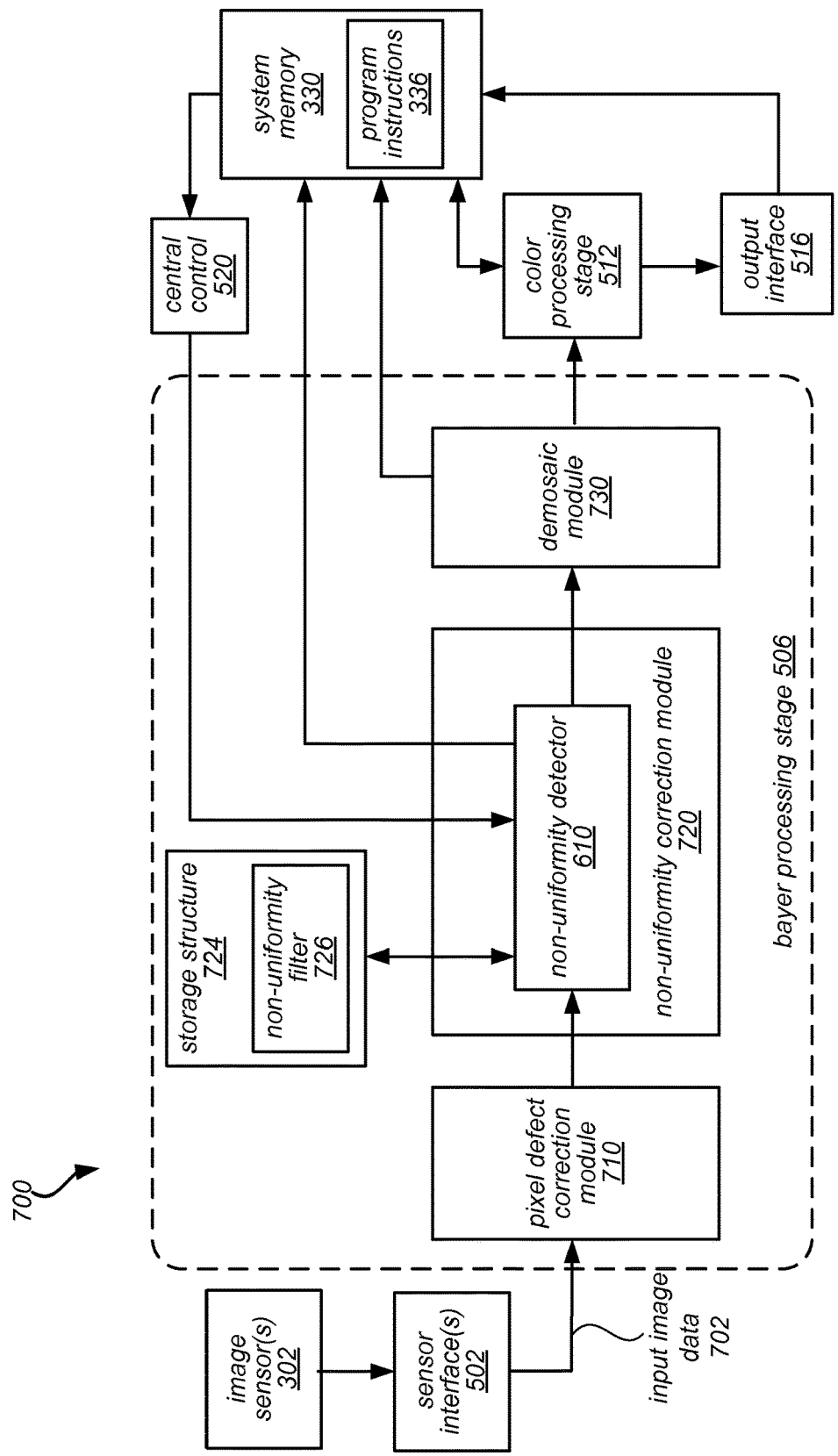
FIG. 7 is a logical block diagram illustrating an example Bayer processing stage in an image signal processor, according to some embodiments.

FIG. 7 is a logical block diagram illustrating an example Bayer processing stage 506 in an image signal processor system 700, according to some embodiments. As discussed above, a system including a Bayer color filter array is just one possible example, and other types of color filtering schemes may be used in other embodiments. In one embodiment, Bayer processing stage 506 may include a pixel defect correction module 710 coupled to a non-uniformity correction module 720, which may in turn be coupled to a demosaic module 730. In an embodiment, pixel defect correction module 710 may receive as input image data 702 image data in an image sensor format (e.g., raw pixel data) from sensor interface(s) 502, which are connected to image sensor(s) 302. In other embodiments, pixel defect correction module 710 may receive stored image data (e.g., processed image data in a color space format) from system memory 330, image data from other stages in front-end 530 of ISP 306, and/or processed image data from one or more stages of back-end 540 of the pipeline of ISP 306 in various color space formats. In one embodiment, pixel defect correction module 710 may perform preliminary processing of input image data 702 to fill in special modified pixels in a repeating pattern and/or correct other pixel-related errors in the input data prior to passing the data to non-uniformity correction module 720.

In various embodiments, Bayer processing stage 506 may receive input data from multiple sources, including control data from central control 520, input image data 702 (e.g., raw pixel data) from sensor interface(s) 502, stored image data (e.g., processed red green blue (RGB) data, or luminance blue-difference red-difference chroma (YCbCr) data) from system memory 330, or processed pixel data from a back-end module (e.g., Y data from the back-end of the pipeline). Similarly, in some embodiments Bayer processing stage 506 may provide output data to multiple destinations, such as system memory 330 and/or directly to color processing stage 512 or another stage of back-end 540 of the ISP pipeline.

In one embodiment, non-uniformity correction module 720 may receive input data from pixel defect correction module 710. Similarly, non-uniformity correction module 720 may receive input reference data, such as data corresponding to non-uniformity filter 726, from a storage structure 724 connected to non-uniformity correction module 720. In various embodiments, storage structure 724 may include registers, memory devices, or other types of storage modules. In an embodiment, non-uniformity correction module 720 may receive control signals from a processor or control module, such as central control 520. In an embodiment, non-uniformity correction module 720 may include one or more modules, such as a non-uniformity detector 610. Although not illustrated, in some embodiments, at least portions of lens flare detector 620 and/or lens flare corrector 630 may be implemented in circuitry of non-uniformity correction module 720. In one embodiment, non-uniformity correction module 720 may implement, perform, and/or otherwise facilitate various functions illustrated in FIGS. 8-12, which are discussed below.

In an embodiment, a module, such as non-uniformity detector 610, of non-uniformity correction module 720 may be configured to compensate for lens flares during image processing by multiplying pixel values by adjustable pixel detection values of a programmable kernel non-uniformity filter 726. One embodiment of a programmable kernel non-uniformity filter 726 is illustrated in FIG. 9, which is discussed below. For example, non-uniformity correction module 720 may multiply values corresponding to one or more green (i.e., Gr or Gb) pixels in an input image by one or more numerical values of non-uniformity filter 726, where the values in the non-uniformity filter 726 correspond to the relative locations of the neighboring green pixels to the pixel that the non-uniformity filter 726 is applied to, and the non-uniformity filter 726 may be applied by convoluting it with input image data 702 whenever the center pixel is green.

In one embodiment, non-uniformity detector 610 of non-uniformity correction module 720 may use non-uniformity filter 726 to detect one or more suspected lens flares in regions of an input image and calculate an estimate of the local non-uniformity as a means to configure one or more modules of non-uniformity correction module 720. In an embodiment, lens flare detector 620, which may be implemented by program instructions 336 executable on CPU(s) 308, may determine a correlation between the non-uniformity filter 726 and data corresponding to the signal magnitude (i.e., the strength or brightness) of a lens flare in image sensor color pattern data corresponding to an input image. In one embodiment, non-uniformity correction module 720 may use the correlation between green non-uniformity and lens flare strength to estimate a magnitude of a lens flare in image sensor color pattern data corresponding to one or more regions of an input image, and lens flare detector 620 may generate a reference map that identifies one or more suspected flare locations relative to pixels of the image sensor color pattern and/or regions of an input image. Lens flare corrector 630, which may be implemented by program instructions 336 executable on CPU(s) 308, may then selectively determine one or more pixel data correction values and apply the pixel data correction values to the pixel data to subtract out (i.e., reduce or remove) the effects of one or more lens flares based at least in part on the reference map. In various embodiments, non-uniformity detector 610, lens flare detector 620, and/or lens flare corrector 630, may be configured to access data stored in storage structure 724 (e.g., to access programmable values of non-uniformity filter 726). Similarly, non-uniformity correction module 720 and/or non-uniformity detector 610 may be configured to receive commands, program instructions, or other control signals from central control 520 and/or CPU(s) 308.

In an embodiment, one or more modules of non-uniformity correction module 720 may utilize a matrix convolution to apply non-uniformity filter 726, thereby generating the estimate of the local green non-uniformity. In some embodiments, a low-pass filtering may be applied to the output of the non-uniformity filter 726 operation to reduce or remove noise in the estimate of the local green non-uniformity. In one embodiment, the representative map may include a thumbnail image of lens flare data corresponding to the input image (i.e., a thumbnail image that highlights one or more non-uniformities of the input image). In another embodiment, other stages in back-end 540 of ISP 306 may use the representative map to subtract out (i.e., reduce or remove) data corresponding to the lens flare and/or non-uniformities from the input image. For example, stages later in the pipeline of ISP 306 (i.e., stages in back-end 540) may optionally use output data of Bayer processing stage 506, such as an image map or a thumbnail image, to correct non-uniformities in image data. The circuitry of ISP 306 and non-uniformity correction module 720 is thus configured to remove a significant portion of the effects of lens flare prior to passing the image data to a demosaic stage, such as demosaic module 730, and/or a color adjustment stage, such as color processing stage 512, for further processing.

In one embodiment, demosaic module 730 may interpolate a full-color domain for image data to perform functions including lens shading correction, white balance gain, or highlight recovery. In some embodiments, demosaic module 730 may perform interpolation based on a Bayer CFA pattern, or other CFA patterns. For example, demosaic module 730 may use a 5×5 edge-adaptive filter working on image sensor samples to perform green channel interpolation. In an embodiment, a low pass directional filter may be applied to one or more green pixel values, and a high pass or gradient filter may be implemented on the color channel (s) adjacent to green pixel(s) on the same row (e.g., either red or blue pixels depending on the row on which the green pixel is located). With respect to interpolating the red and blue channels, demosaic module 730 may implement a low pass filter of the red or blue pixel value along with a high pass filter using the interpolated green values adjacent to the red or blue pixels. In various embodiments, demosaic module 730 may provide output image data directly to color processing stage 512 for further processing, to other stages of back-end 540, and/or to system memory 330 for storage.

Please note that FIG. 7 is provided as merely an example of a possible configuration Bayer processing stage 506. Different combinations of the illustrated components (as well as components not illustrated) may be used to perform conversion from raw pixel data into a full-color domain or scale image data. For example, in some embodiments a noise processing stage may be implemented. In other embodiments, different non-Bayer color filter schemes may be implemented. Thus, the components of FIG. 7 and their respective layout or ordering is not intended to be limiting to the various other combinations which may be used by Bayer processing stage 506.

Figure 8:
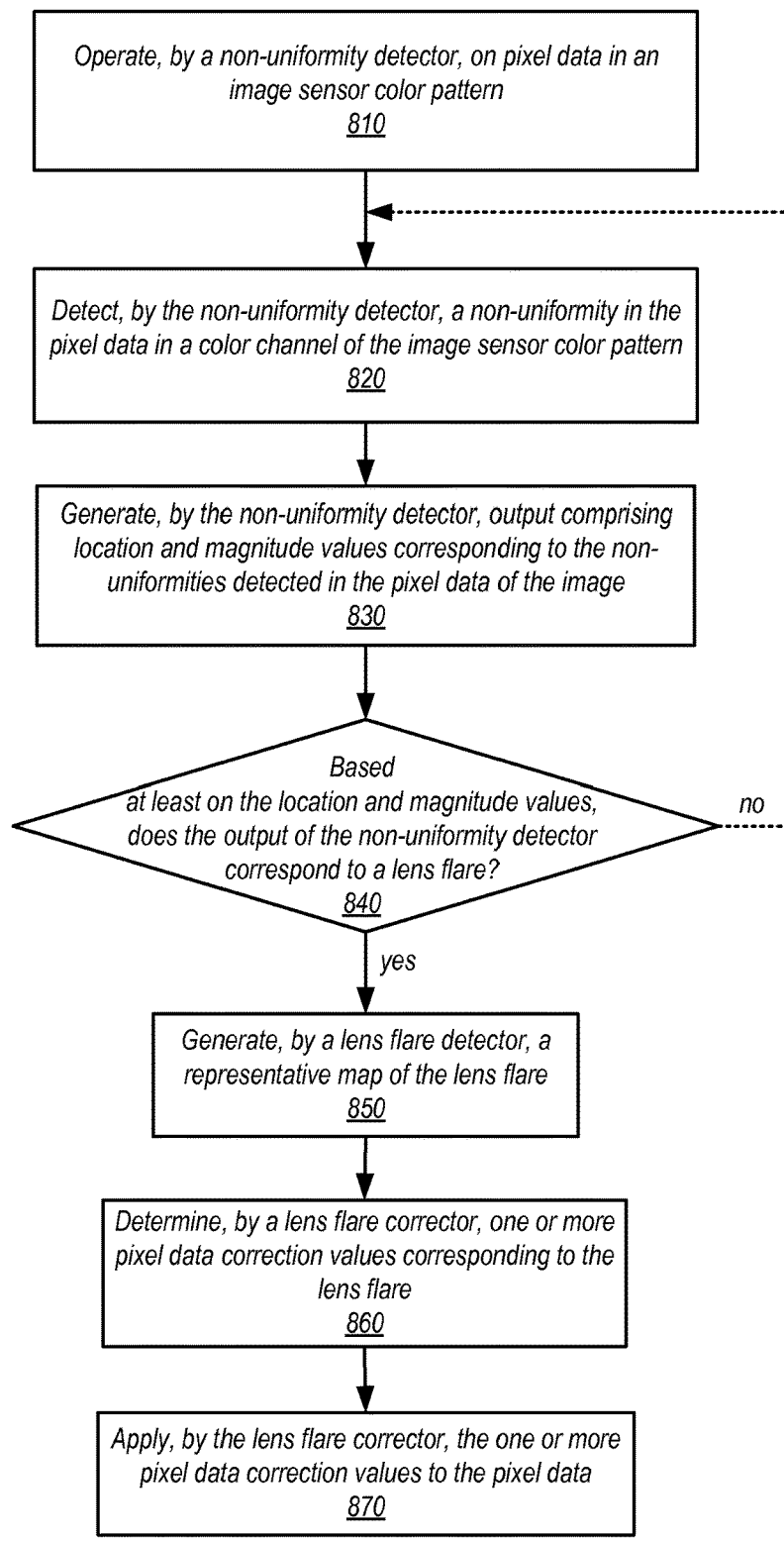
FIG. 8 is a high-level flowchart illustrating various methods and techniques for automatic lens flare compensation, according to some embodiments.

FIGS. 3-7 provide an example of an image processing pipeline, image signal processor, and system which may implement automatic lens flare compensation in image data in an image processing pipeline. However, numerous other types or configurations of systems or devices that implement an image processing pipeline and image signal processor may perform automatic lens flare compensation. FIG. 8 is a high-level flowchart illustrating various methods and techniques for automatic lens flare compensation, according to some embodiments. The various components described above may implement these techniques (in addition to those described with regard to FIGS. 9-12 below), as well as various other image processing pipelines and image signal processors.

In various embodiments, the functions of detecting non-uniformities, estimating the magnitude (i.e., strength) of non-uniformities, and/or removing non-uniformities in image data may be performed by various combinations of hardware and/or software. In one embodiment, a hardware module, such as resample processing stage 508 and/or non-uniformity correction module 720 may at least initially process image data to detect non-uniformities and estimate the magnitude of the non-uniformities prior to passing data corresponding to the detected non-uniformities and/or the estimated magnitudes of the non-uniformities on to processor-executable software, such as program instructions 336, for further processing to remove the non-uniformities and other effects of flare or at least reduce the effects of the flare in the image data. In other embodiments, the functions described above may all be implemented by one or more hardware modules. While in an alternate embodiment, the functions described above may all be implemented in processor-executable software, such as program instructions 336. Note that in an all-software embodiment, sensor interface(s) 502 may be configured to save an initial version of raw pixel data corresponding to an input image received from image sensor(s) 302 in system memory 330, thereby preserving a version of the raw pixel data for processing by the software (i.e., preserving the raw pixel data before the front-end 530 or back-end 540 stages of ISP 306 process the image data).

As indicated at 810, a non-uniformity detector, such as non-uniformity detector 610 of non-uniformity correction module 720, may operate on pixel data in an image sensor color pattern. In an embodiment, the image sensor color pattern may include one or more GNU values of multiple pixels of input data in an image sensor format (e.g., input image data 702), wherein the one or more GNU values include a difference in signal magnitude between a first type of green pixel (Gb or Gr) of a Bayer color filter mosaic (e.g., a Bayer CFA) and a second type of green pixel of the Bayer color filter mosaic. In one embodiment, detecting one or more GNU values may include determining a difference in levels between the two types of the green pixels (i.e., the difference between the green "Gr" pixels on the CFA rows with red pixels and the green "Gb" pixels on the CFA rows with blue pixels). In an embodiment, a GNU value may be proportional to the difference between Gr minus Gb. In various embodiments, the local GNU may be determined via one or more stages of matrix convolution of image data and the subsequent convolution results. The resulting GNU signal may then be low-pass filtered to smooth the signal out.

In an embodiment, a stream of image data in an image sensor format (e.g., raw pixel data) including an image sensor color pattern may be received at an image signal processor (ISP). Raw pixel data may be captured and processed in stream fashion as it is collected at an image sensor. In one embodiment, image data in an image sensor format, as discussed above, may be formatted such that multiple color components or channels are not included for an individual pixel. An example of image data in an image sensor format is a Bayer image format (of which there may be many variations) that includes different rows of pixel values for collecting light in different colors, green, red, and blue, which depend on the configuration of the image sensor. These pixel values (e.g., green values, red values, or blue values) may be collected and provided in raster order to the image signal processor, in some embodiments.

As depicted in block 820, the non-uniformity detector 610 may detect a non-uniformity in the pixel data in a color channel of the image sensor color pattern. As shown in block 830, the non-uniformity detector 610 may generate output that may include location and magnitude values corresponding to the non-uniformities detected in the pixel data of the image. In some embodiments, the non-uniformity detector 610 of non-uniformity correction module 720 may apply a GNU filter, such as non-uniformity filter 726, to multiple green pixels (e.g., Gr and Gb pixels) of the input image. In one embodiment, a GNU filter may include a kernel filter of detection values corresponding to pixels and/or regions of an input image, and applying a GNU filter may include multiplying signal values of multiple pixels (e.g., green pixels) of the input image by the respective detection values. An example GNU filter is shown in FIG. 9, which is discussed below. In an embodiment, applying a GNU kernel filter, such as a matrix including a range of numbers (e.g., positive integers, negative integers, and/or zero values) corresponding to relative locations of neighboring pixels that are used for the filter operation, may result in green non-uniformity values. Applying a GNU kernel filter in convolution operations to multiple pixels may result in the detection of green differences. In one embodiment, applying a GNU kernel filter may provide data used to configure the non-uniformity correction module 720 with respect to one or more input images.

As depicted in block 840, a lens flare detector 620 determines whether, based at least on the location and magnitude values, the output of the non-uniformity detector 610 corresponds to a lens flare. In an embodiment, the signal magnitude values of the flare pixels may correspond to the brightness, color, and/or strength of the light detected by the pixels in one or more region(s) of the image that are subject to lens flare (e.g., the brightness in various image regions of a false color detected by an image sensor as the result of stray light). In one embodiment, a purple blob type pattern may correspond to a lens flare detected by the checkerboard pattern in the green pixels in a region of an input image, where the checker pattern (i.e., alternating regions of relatively darker/lighter signal magnitude values) is a result of the difference between the signal magnitude values detected by Gr and Gb pixels (i.e., green non-uniformities). In an embodiment, the correlation between local GNU values and the flare pixels (e.g., flare color and/or signal magnitude values) may be used by a module, such as non-uniformity detector 610, to discriminate between the scene content and at least a portion of the flare.

As indicated at block 850, in some embodiments, lens flare detector 620 may generate a representative map of the lens flare. In various embodiments, the representative map may be a thumbnail image, a matrix, or another type of mapping configured to identify one or more lens flare values in one or more regions of an input image. An example of a representative map is illustrated in FIG. 10, which is discussed below.

As depicted in block 860, a lens flare corrector 630 determines one or more pixel data correction values corresponding to the lens flare. For example, in some embodiments the one or more pixel data correction values may be based at least in part on attributes of the representative map. As shown in block 870, the lens flare corrector 630 applies the one or more pixel data correction values to the pixel data, thereby removing at least a portion of the lens flare from the image data.

In an embodiment, non-uniformity correction module 720 and/or program instructions 336 may calculate a lens flare light source (i.e., stray light source) directional factor based on a GNU polarity value. In various embodiments, a GNU polarity value may be based on a difference of Gr-Gb or Gb-Gr, thereby enabling the GNU correction module to determine the direction or orientation of the lens flare light source with respect to image sensor(s) 302 due to the relationship between the angle of the stray light and the amount of GNU detected. In one embodiment, program instructions 336 may be configured to remove leftover portions of a lens flare by darkening or desaturation of pixels adjacent to the "known" lens flare identified by the GNU hardware module and/or by adjusting one or more pixel color values. In one embodiment, program instructions 336 may identify leftover portions of a lens flare by searching for purple regions near the edge of an image and/or purple regions near a known flare.

In an embodiment, ISP 306 and lens flare corrector 630 may be configured to perform lens flare compensation on a series of multiple images of a scene (e.g., a set of "burst mode" images), thereby enabling a camera system to select a "best" image from the series of images based on a series of representative maps generated by lens flare corrector 630 corresponding to the images and/or the amount of lens flare removed from each image. In another embodiment, ISP 306 and/or lens flare corrector 630 may be configured to provide real-time image sensor orientation and/or stabilization feedback data based on a comparison of an amount of lens flare detected in multiple sequential representative maps generated by lens flare corrector 630. For example, non-uniformity correction module 720 may estimate an amount of lens flare in real time and provide the data to a processor and/or camera image sensor stabilization module configured to adjust the position or orientation of an image sensor via electro-mechanical motors (e.g., piezo-electric image sensor stabilization units), thereby enabling a camera system to dynamically adjust the orientation of an image sensor in real time into an orientation that results in a minimum amount of detected lens flare.

In one embodiment, program instructions 336 may be configured to use the output of non-uniformity correction module 720 as a "seed" location and to perform processing of adjacent regions of the image in order to correct additional areas of the lens flare that may have been missed by the hardware module. Further processing of image data based on seed locations may include the use of corroborating factors, such as a count of detected local non-uniformity values with respect to a region of interest in image data, a detected color of local pixels (e.g., a purple color), a pattern of local pixel values (e.g., an alternating "checkerboard" pattern), the presence of a detected non-uniformity on a nearby edge of an image with respect to a region of interest, and/or a non-uniformity magnitude (i.e., strength) value that exceeds a dynamically adjustable non-uniformity magnitude threshold value. Hardware modules, such as non-uniformity correction module 720 and/or processor-executable software, such as program instructions 336, may be configured to perform further processing of image data based on corroborating factors in order to remove or at least further reduce the effects of non-uniformities from image data. In various other embodiments, one or more of the functions of non-uniformity correction module 720 described above may be performed by (or in some cases in cooperation with) other stages of ISP 306 and/or by a processor, such as CPU(s) 308 or graphics processor 320. Similarly, in other embodiments, one or more of the functions of non-uniformity correction module 720 described above may be performed by program instructions 336.

Similarly, in various embodiments, program instructions 336 executable on one or more processors or circuitry (e.g., CPU(s) 308), may perform the functions of lens flare detector 620 and/or lens flare corrector 630 described above. In other embodiments, the functions of lens flare detector 620 and/or lens flare corrector 630 described above may be performed by one or more hardware modules, including, but not limited to, Bayer processing stage 506, non-uniformity correction module 720, or one or more stages of ISP 306. In some embodiments, the functions of lens flare detector 620 and/or lens flare corrector 630 described above may be performed by various combinations of hardware (e.g., one or more stage(s) of ISP 306) and software (e.g., program instructions 336).

In one embodiment, an image may be divided into a grid having multiple regions (e.g., in a manner similar to the configuration of FIG. 1), such that each block of the grid may have one or more values based on image attributes detected by one or more pixels of image sensor(s) 302 and/or one or more values based on output data from one or more stages of ISP 306. A hardware module, such as Bayer processing stage 506, may be configured to generate output data corresponding to automatic lens flare compensation and interface with software (e.g., program instructions 336) stored in a memory module and executable by a processor in order to compensate for lens flare data in an image. Program instructions 336 may thus dynamically adjust one or more attributes of an image in response to image data received from one or more hardware modules.

FIG. 9 is a logical block diagram illustrating an example programmable kernel non-uniformity filter 726 for automatic lens flare compensation, according to some embodiments. In an embodiment, programmable non-uniformity filter 726 may be stored in a memory module (e.g., storage structure 724) accessible by Bayer processing stage 506, image signal processor 306, and/or central control 520. In one embodiment, adjustable non-uniformity filter 726 may be configured to include multiple blocks 902A-N corresponding to the filter coefficients or taps used to filter an input image. Each of blocks 902A-N may be associated with one programmable (i.e., adjustable) data value stored in storage structure 724 or in another memory module. In an embodiment, the programmable data value may include a detection factor configured to detect and/or counteract green imbalances (i.e., green non-uniformities) within an image. In an embodiment, non-uniformity filter 726 may be a kernel filter configured to be applied to only some of the pixels in the image, such as only green pixels, either Gr or Gb. In some embodiments, a block may not include a detection factor (e.g., a detection factor having a value of zero) if the respective pixel corresponds to a red pixel or a blue pixel.

FIG. 10 is a logical block diagram illustrating an example representative map 1000 for automatic lens flare compensation, according to some embodiments. In an embodiment, representative map 1000 may include an image frame 1010 corresponding to a processed "thumbnail" representation of input image data. In one embodiment, representative map 1000 may include one or more representation(s) of image artifacts, such as colored object 1020, which may correspond to a location and/or magnitude of various frequencies, wavelengths, and/or colors of light detected in respective regions of an input image. Similarly, representative map 1000 may include location, size, shape, and/or magnitude data corresponding to representations of one or more lens flare(s) 1030 detected within the input image. For example, in the embodiment of FIG. 10, lens flare 1030 may correspond to a shape, size, color, and/or magnitude (i.e., strength) of a lens flare detected in an input image, and colored object 1020 may correspond to a shape, size, color, and/or magnitude (i.e., strength) of an object, a light source, a reflection, or a surface in the scene corresponding to the input image of image frame 1010. In one embodiment, colored object 1020 may represent a purple light source in the input image having a color similar to that of a typical lens flare (in other words, a suspected artifact), while lens flare 1030 may correspond to a purple region of the image that is actually a lens flare. Other regions of representative map 1000 may be left blank, zeroed out, or blacked out, in response to no suspected lens flares and/or actual lens flares being detected in the respective regions. Representative map 1000 may thus be used to identify, highlight, and/or document various attributes of lens flares and suspected lens flares in input image data, and representative map 1000 may be utilized by hardware modules, such as lens flare corrector 630, or software, such as program instructions 336, to perform further processing of the input image data and thereby remove lens flares from the image data. In various embodiments, representative map 1000 may be stored in storage structure 724 or system memory 330.

Figure 11:
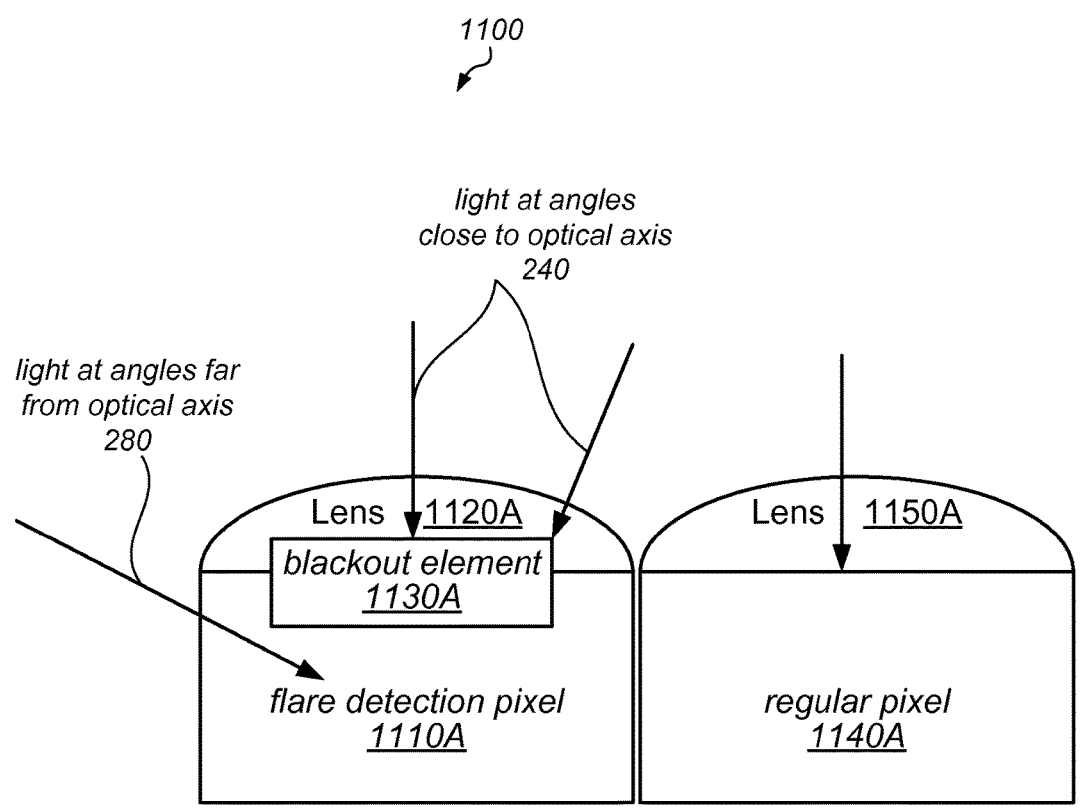
FIG. 11 is a logical block diagram illustrating an example flare detection pixel for automatic lens flare compensation, according to some embodiments.

FIG. 11 is a logical block diagram illustrating an example system 1100 including flare detection pixels for automatic lens flare compensation, according to some embodiments. In an embodiment, one or more pixels of image sensor(s) 302 may include specialized "masked" flare detection pixels 1110A-N. The masked flare detection pixels 1110A-N may include lenses 1120A-N and blackout elements 1130A-N, respectively, positioned between lenses 1120A-N and flare detection pixels 1110A-N such that mask "blackout" elements 1130A-N may block (or absorb) light at multiple angles near (or close to) the optical axis 240, while admitting light at multiple angles that fall outside an image view of the image sensor. In other words, angles far from the optical axis 280 to reach (and thus be detected by) pixels 1110A-N. Blackout elements 1130A-N thus provide a means of enabling flare detection pixels 1110A-N to primarily detect stray light (i.e., light away from the optical axis) that might result in a lens flare. In one embodiment, flare detection pixels 1110A-N may be positioned primarily along the edges of an image sensor array (i.e., in areas of an image sensor array where stray light is most likely to cause lens flares). In an alternate embodiment, blackout elements 1130A-B may be positioned on top of lenses 1120A-N. As depicted, system 1100 may also include multiple regular pixels 1140A-N having lenses 1150A-N without blackout elements. Regular pixels 1140A-N may thus be configured to primarily detect light at angles close to an optical axis 240.

Figure 12:
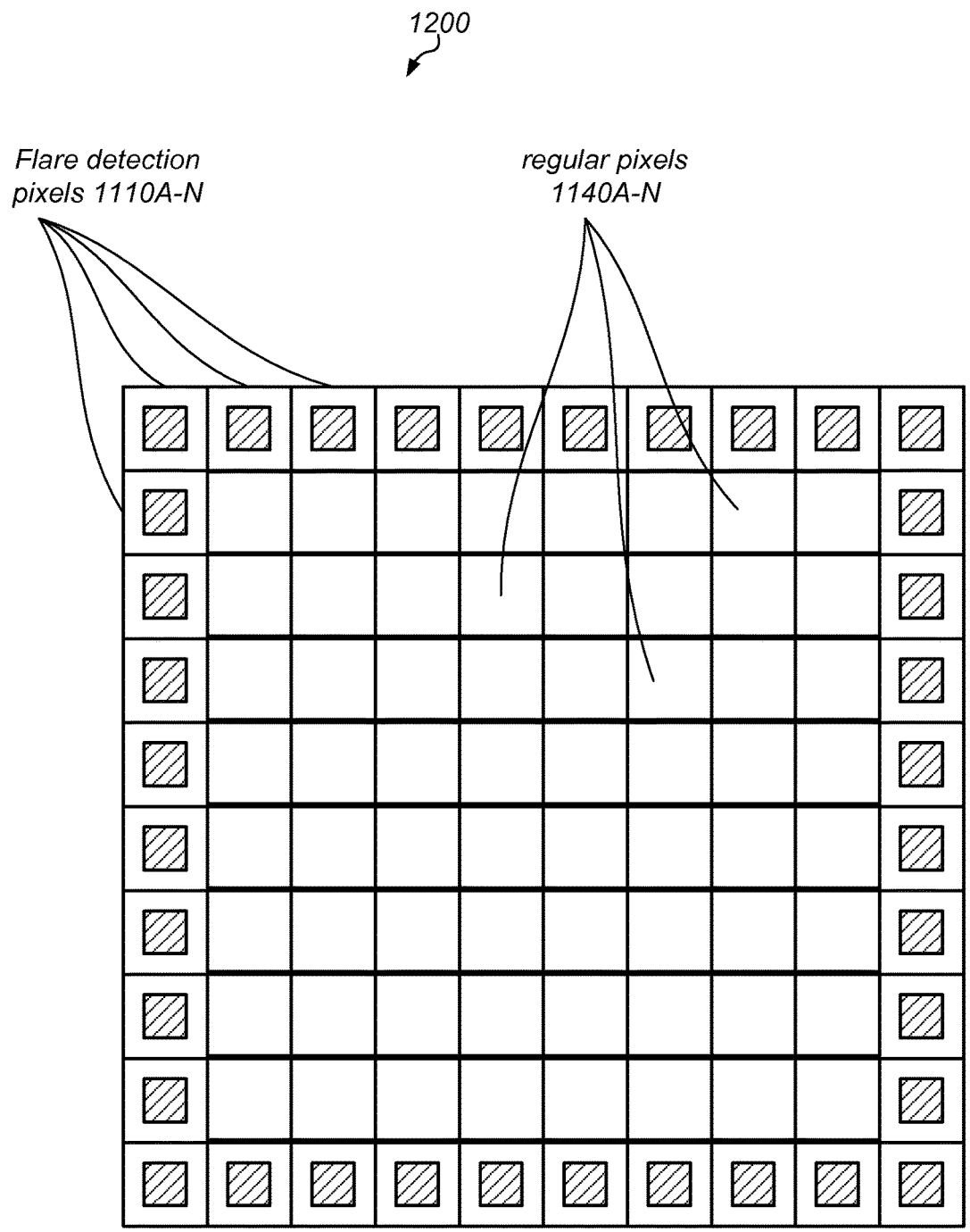
FIG. 12 is a logical block diagram illustrating an example configuration of flare detection pixels for automatic lens flare compensation, according to some embodiments.

FIG. 12 is a logical block diagram illustrating an example system 1200 including a configuration of flare detection pixels 1110A-N for automatic lens flare compensation, according to some embodiments. In an embodiment, flare detection pixels 1110A-N may be configured to be primarily located around the edges or otherwise close to the perimeter of an image sensor, while regular pixels 1140A-N may be configured to be primarily located in one or more central regions of an image sensor with respect to the full set of pixels of the image sensor. Since lens flare artifacts are typically more prevalent at the edges of an image (and thus around the edges of a pixel array), positioning a majority of the flare detection pixels 1110A-N near the edges of the pixel array may be advantageous, thereby enabling flare detection pixels 1110A-N to selectively provide an alarm signal if light at angles far from the optical axis is detected. In an alternate embodiment, one or more of the flare detection pixels 1110A-N may be configured to be distributed throughout one or more central positions within the pixel array, and the gaps in image data from light along the optical axis that is blocked by the flare detection pixels 1110A-N may be compensated for by hardware modules and/or software using data from regular pixels 1140A-N to fill in any blank spots in the image data.

A system for automatic lens flare compensation may thus be configured to automatically compensate for the lens flare by estimating local green non-uniformities, determining a relationship between GNU and lens flare strength, generating an estimate of the lens flare in each part of an image, and subtracting at least a portion of the lens flare artifact from the image to produce an output image with less lens flare artifacts. In an embodiment, the initial processing of image data may be efficiently implemented in one or more hardware modules configured to analyze pixel data of an input image. In some embodiments, a software application may perform additional processing by using the output image from the hardware module to identify seed locations of suspected lens flares and then adjust adjacent pixels (e.g., via darkening and/or desaturation) to further remove residual lens flare artifacts from the image data.

What is claimed is:

1. A hardware device, comprising:
 a storage structure configured to store a non-uniformity filter comprising a plurality of non-uniformity detection values corresponding to an image sensor color pattern;
 a non-uniformity detector connected to the storage structure and implemented by one or more processors or circuitry configured to:
   operate on pixel data for an image in an image sensor color pattern;
   apply the plurality of non-uniformity values of the non-uniformity filter to the pixel data of the image to detect a non-uniformity in the pixel data in a color channel of the image sensor color pattern; and generate color channel output comprising location and magnitude values corresponding to the non-uniformity detected in the pixel in the color channel;

a lens flare detector implemented by one or more processors or circuitry configured to determine, based at least on the color channel output comprising location and magnitude values corresponding to the non-uniformity in the pixel data in the color channel, whether the color channel output of the non-uniformity detector corresponds to a lens flare in the image; and a lens flare corrector implemented by one or more processors or circuitry configured to:

determine one or more pixel data correction values corresponding to the lens flare; and apply the one or more pixel data correction values to the pixel data.

2. The hardware device of claim 1, wherein the non-uniformity detector is implemented in circuitry of an image signal processor (ISP).

3. The hardware device of claim 1, wherein the image sensor color pattern comprises a Bayer color pattern, and wherein a color of the image sensor color pattern used to detect the non-uniformity comprises green.

4. The hardware device of claim 1, wherein the lens flare detector is implemented in program instructions executable by one or more processors.

5. The hardware device of claim 1, wherein the lens flare corrector is implemented in program instructions executable by one or more processors.

6. The hardware device of claim 1, further comprising an image sensor that comprises a plurality of masked pixels configured to detect light entering the image sensor from a plurality of angles that fall outside an image view of the image sensor, wherein the plurality of masked pixels comprise blackout elements configured to:

block light from a plurality of angles near an optical axis; and admit light from the plurality of angles that fall outside the image view, wherein the non-uniformity detector is configured to detect values in the pixel data for the plurality of masked pixels.

7. A method for image signal processing, comprising:

applying a plurality of non-uniformity detection values corresponding to an image sensor color pattern to pixel data of an image to detect, by a non-uniformity detector implemented by one or more processors or circuitry, a non-uniformity in pixel data for an image in a color channel of an image sensor color pattern;

generating, by the non-uniformity detector, color channel output comprising location and magnitude values corresponding to the non-uniformity detected in the pixel data in the color channel;

determining, by a lens flare detector implemented by one or more processors or circuitry and based at least on the color channel output comprising location and magnitude values corresponding to the non-uniformity in the pixel data in the color channel, whether the color channel output of the non-uniformity detector corresponds to a lens flare in the image;

determining, by a lens flare corrector implemented by one or more processors or circuitry, one or more pixel data correction values corresponding to the lens flare; and applying, by the lens flare corrector, the one or more pixel data correction values to the pixel data.

8. The method of claim 7, further comprising generating, in response to determining that the output of the non-uniformity detector corresponds to the lens flare, a representative map of the lens flare.

9. The method of claim 8, further comprising generating real-time image sensor or optical system orientation feedback data based on a comparison of a plurality of sequential representative maps.

10. The method of claim 8, further comprising selecting a particular image from a series of related images based on a comparison of a plurality of representative maps generated by the lens flare detector for respective images of the series of related images.

11. A computing device, comprising:

an image sensor connected to a sensor interface;

a non-uniformity filter comprising a plurality of non-uniformity detection values corresponding to an image sensor color pattern of the image sensor;

a central processing unit;

a display connected to the central processing unit;

a system memory connected to the central processing unit; and an image signal processor connected to the sensor interface and the central processing unit, wherein the image signal processor comprises:

a non-uniformity detector configured to:

operate on pixel data for an image in an image sensor color pattern;

apply the plurality of non-uniformity detection values to the pixel data of the image to detect a non-uniformity in the pixel data in a color channel of the image sensor color pattern; and generate color channel output comprising location and magnitude values corresponding to the non-uniformity detected in the pixel data in the color channel;

a lens flare detector implemented by one or more processors or circuitry configured to determine, based at least on the color channel output comprising location and magnitude values corresponding to the uniformity in the pixel data in the color channel, whether the color channel output of the non-uniformity detector corresponds to a lens flare in the image; and a lens flare corrector implemented by one or more processors or circuitry configured to:

determine one or more pixel data correction values corresponding to the lens flare; and apply the one or more pixel data correction values to the pixel data.

12. The computing device of claim 11, wherein the image sensor color pattern comprises a Bayer color pattern, and wherein a color of the image sensor color pattern used to detect the non-uniformity comprises green.

13. The computing device of claim 11, wherein the lens flare corrector is implemented in program instructions executable by one or more processors.

14. The computing device of claim 11, wherein the image sensor comprises a plurality of masked pixels configured to detect light entering the image sensor from a plurality of angles that fall outside an image view of the image sensor, wherein the plurality of masked pixels comprise blackout elements configured to:

block light from a plurality of angles near an optical axis; and admit light from the plurality of angles that fall outside the image view.

15. The computing device of claim 11, wherein the lens flare detector is configured to generate, in response to determining that the output of the non-uniformity detector corresponds to the lens flare, a representative map of the lens flare.

16. The computing device of claim 15, wherein the lens flare detector is configured to generate real-time image sensor orientation feedback data based on a comparison of a plurality of sequential representative maps generated by the lens flare detector.

17. The computing device of claim 15, wherein the central processing unit is configured to detect a particular image from a series of related images based on a comparison of a plurality of representative maps generated by the lens flare detector for respective images of the series of related images.

\* \* \* \* \*